(12) United States Patent
Nequist et al.

(10) Patent No.: US 7,100,128 B1
(45) Date of Patent: Aug. 29, 2006

(54) ZONE TREE METHOD AND MECHANISM

(75) Inventors: Eric Nequist, Monte Sereno, CA (US); Jeffrey Scott Salowe, Cupertino, CA (US); Steven Lee Pucci, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 430 days.

(21) Appl. No.: 10/342,823

(22) Filed: Jan. 14, 2003

(51) Int. Cl.
G06F 17/50 (2006.01)

(52) U.S. Cl. ................................... 716/4; 716/7; 716/2
(58) Field of Classification Search ............... 716/4, 716/7, 2
See application file for complete search history.

(56) References Cited

U.S. PATENT DOCUMENTS

| | | | | |
|---|---|---|---|---|
| 4,831,725 A * | 5/1989 | Dunham et al. | ............... | 29/847 |
| 5,157,618 A | 10/1992 | Ravindra et al. | | |
| 5,375,069 A * | 12/1994 | Satoh et al. | ................... | 716/14 |
| 5,497,334 A * | 3/1996 | Russell et al. | ................. | 716/5 |
| 5,610,828 A * | 3/1997 | Kodosky et al. | ............... | 716/11 |
| 5,818,729 A * | 10/1998 | Wang et al. | ..................... | 716/9 |
| 5,831,865 A * | 11/1998 | Berezin et al. | ................ | 716/7 |
| 5,850,350 A * | 12/1998 | Shibuya et al. | ................ | 716/8 |
| 5,911,061 A | 6/1999 | Tochio et al. | | |
| 6,009,250 A * | 12/1999 | Ho et al. | ........................ | 716/5 |
| 6,009,251 A * | 12/1999 | Ho et al. | ........................ | 716/5 |
| 6,011,911 A * | 1/2000 | Ho et al. | ........................ | 716/5 |
| 6,253,363 B1 | 6/2001 | Gasanov et al. | | |
| 6,286,128 B1 * | 9/2001 | Pileggi et al. | ................ | 716/18 |
| 6,292,929 B1 * | 9/2001 | Scepanovic et al. | .......... | 716/14 |
| 6,324,675 B1 | 11/2001 | Dutta et al. | | |
| 6,349,403 B1 | 2/2002 | Dutta et al. | | |
| 6,415,426 B1 * | 7/2002 | Chang et al. | .................. | 716/9 |
| 6,418,551 B1 * | 7/2002 | McKay et al. | ................. | 716/5 |
| 6,442,743 B1 * | 8/2002 | Sarrafzadeh et al. | .......... | 716/10 |
| 6,536,024 B1 * | 3/2003 | Hathaway | ....................... | 716/6 |
| 6,543,039 B1 * | 4/2003 | Watanabe | ...................... | 716/7 |
| 6,557,145 B1 * | 4/2003 | Boyle et al. | .................... | 716/2 |
| 6,560,505 B1 * | 5/2003 | Kikuchi et al. | ............ | 700/121 |
| 6,625,611 B1 | 9/2003 | Teig et al. | | |
| 6,637,010 B1 * | 10/2003 | Yamamoto | ..................... | 716/2 |
| 6,668,365 B1 * | 12/2003 | Harn | .......................... | 716/10 |
| 6,701,306 B1 | 3/2004 | Kronmiller et al. | | |
| 6,785,874 B1 | 8/2004 | Tsukuda | | |
| 6,792,582 B1 * | 9/2004 | Cohn et al. | .................... | 716/7 |

(Continued)

FOREIGN PATENT DOCUMENTS

JP        11066111 A  *  3/1999

OTHER PUBLICATIONS

Kim et al., "An Efficient CPLD Technology Mapping Under the Time Constraint", Proceedings of the 12th International Conference on Microelectronics, Oct. 31-Nov. 2, 2000, pp. 265-268.*

(Continued)

Primary Examiner—Phallaka Kik
(74) Attorney, Agent, or Firm—Bingham McCutchen LLP

(57) ABSTRACT

A method of analyzing a design of an electronic circuit uses slices. The method includes generating one or more slices, each slice comprising a contiguous region of the design, and generating an set comprising one or more bins for each slice. A search for an object may be performed by determining a search area, and identifying slices containing at least a portion of the search area. For each identified slice, each object within the search area is associated with one of the bins of the set for the slice.

36 Claims, 14 Drawing Sheets

U.S. PATENT DOCUMENTS

| | | | |
|---|---|---|---|
| 6,829,754 B1 * | 12/2004 | Yu et al. ................ | 716/5 |
| 6,851,099 B1 * | 2/2005 | Sarrafzadeh et al. .......... | 716/10 |
| 6,859,916 B1 * | 2/2005 | Teig et al. .................... | 716/13 |
| 6,871,328 B1 * | 3/2005 | Polk .............................. | 716/1 |
| 6,904,584 B1 * | 6/2005 | Brenner et al. ................ | 716/13 |
| 6,961,916 B1 * | 11/2005 | Sarrafzadeh et al. .......... | 716/10 |
| 2001/0003843 A1* | 6/2001 | Scepanovic et al. ........... | 716/7 |
| 2001/0010090 A1* | 7/2001 | Boyle et al. ................... | 716/2 |
| 2002/0029370 A1* | 3/2002 | Michalewicz et al. ......... | 716/4 |
| 2002/0038445 A1* | 3/2002 | Yamamoto ..................... | 716/2 |
| 2002/0059194 A1 | 5/2002 | Choi et al. | |
| 2002/0116686 A1* | 8/2002 | Shin et al. ...................... | 716/2 |
| 2002/0138816 A1* | 9/2002 | Sarrafzadeh et al. .......... | 716/10 |
| 2003/0088839 A1* | 5/2003 | Watanabe ....................... | 716/7 |
| 2003/0163297 A1* | 8/2003 | Khaira et al. .................. | 703/15 |
| 2003/0182649 A1* | 9/2003 | Harn ............................ | 716/11 |
| 2003/0208737 A1* | 11/2003 | Brenner et al. ............... | 716/10 |
| 2003/0217338 A1* | 11/2003 | Holmes et al. ................ | 716/2 |
| 2004/0040007 A1* | 2/2004 | Harn ............................. | 716/11 |
| 2004/0044980 A1 | 3/2004 | Juengling | |
| 2004/0060022 A1* | 3/2004 | Allen et al. .................... | 716/6 |
| 2005/0204325 A1* | 9/2005 | Fung et al. .................... | 716/16 |

OTHER PUBLICATIONS

Zhu et al., "On the Optimal Search Problem: the Case When the Target Distribution Unknown", Proceedings of XVII International Conference on the Chilean Computer Science Society, Nov. 10-15, 1997, pp. 268-277.*

Yeh et al., "Cost-Effective VLSI Architectures and Buffer Size Optimization for Full-Search Block Matching Algorithms", IEEE Transactions on Very Large Scale Integration (VLSI) Systems, vol. 7, No. 3, Sep. 1999, pp.345-358.*

Ahuja, R.K. et al., eds., *Network Flows, Theory, Algorithms, and Applications* (1993) pp. 510-542, Prentice Hall, Upper Saddle River, NJ.

Al-Yamani, A. et al. "HPTS: Heterogeneous Parallel Tabu Search for VLSI Placement" *Proceedings of the 2002 Congress on Evolutionary Computation* (May 12-17, 2002) 1:351-355.

Anderson, R. et al. "An O(n log n) Algorithm for 1-D Tile Compaction" *ICCAD-89—International Conference on Computer-Aided Design* (Nov. 5-9, 1989) pp. 144-147.

Balasa, F. et al. "Efficient Solution Space Exploration Based on Segment Trees in Analog Placement with Symmetry Constraints" in *IEEE/ACM International Conference on Computer Aided Design* (Nov. 10-14, 2002) pp. 497-502.

Barzaghi, M. et al, "Hierarchical Management of VLSI Cells at Different Description Levels" *Proceedings of the 6th Mediterranean Electrotechnical Conference* (May 22-24, 1991) 1:327-330.

Benetis, R. et al. "Nearest Neighbor and Reverse Nearest Neighbor Queries for Moving Objects" *Proceedings of the International Database Engineering and Applications Symposium (IDEAS'02)* (Jul. 17-19, 2002) pp. 44-53.

Bern, J. et al. "Some Heuristics for Generating Tree-like FBDD Types" *IEEE Transactions on Computer-Aided Design of Integrated Circuits and Systems* (Jan. 1996) 15(1):127-130.

Bhattacharya, S. and W.-T. Tsai "Area Efficient Binary Tree Layout" *1st Great Lakes Symposium on VLSI* (Mar. 1-2, 1991) pp. 18-24.

Blust, G. and D.P. Mehta "Corner Stitching for L-shaped Tiles" *Proceedings of the 3rd Great Lakes Symposium on VLSI, Design Automation of High Performance VLSI Systems* (Mar. 5-6, 1993) pp. 67-68.

Borah, M. et al, "An Edge-Based Heuristic for Steiner Routing" *IEEE Transactions on Computer-Aided Design of Integrtaed Circuits and Systems* (Dec. 1994) 13(12):1563-1568.

Brück, R. and H. Wronn "—geoADDICTION—Flexible Handling of Geometries in IC-Layout Tools" *ISCAS '88—IEEE International Symposium on Circuits and Systems* (Jun. 7-9, 1988) 1:723-726.

Cadence Design Systems, Inc. *IC Shape-Based Technology Chip Assembly User Guide* Product Version 11.0 (Nov. 2001), 134 Pages.

Carlson, E.C. and R.A. Rutenbar "A Scanline Data Structure Processor for VLSI Geometry Checking" *IEEE Transactions on Computer-Aided Design* (Sep. 1987) 6(5):780-794.

Cheung, P. and J. Hesketh "Design Automation Tools for Tile-Based Analogue Cells" *IEE Colloquium on New Directions in VLSI Design* (Nov. 27, 1989) pp. 3/1-3/5.

Chiang, C. and C.-S. Chiang "Octilinear Steiner Tree Construction" *MWSCAS-2002—The 2002 45th Midwest Symposium on Circuits and Systems* (Aug. 4-7, 2002) 1:603-606.

Christian, B.S. et al. "A VLSI Interval Router for High-Speed Networks" *Canadian Confernce on Electrical and Computer Engineering* (May 26-29, 1996) 1:154-157.

Cong, J. et al. "Multilevel Approach to Full-Chip Gridless Routing" *ICCAD 2001—IEEE/ACM International Conference on Computer-Aided Design* (Nov. 4-8, 2001) pp. 396-403.

Curatelli, F. et al. "Efficient Management of Complex Elements in Physical IC Design" *Proceedings of the IEEE International Symposium on Circuits and Systems* (May 1-3, 1990) 1:456-459.

Das, S. and B.B. Bhattacharya "Channel Routing in Manhattan-Diagonal Model" *Proceedings of the 9th International Conference on VLSI Design* (Jan. 3-6, 1996) pp. 43-48.

Dasgupta, P. et al. "Multiobjective Search in VLSI Design" *Proceedings of the 7th International Conference on VLSI Design* (Jan. 1994) pp. 395-400.

Dasgupta, P. et al. "Searching Networks With Unrestricted Edge Costs" *IEEE Transactions on Systems, Man and Cybernetics-Part A: Systems and Humans* (Nov. 2001) 31(6):497-507.

Dijkstra, E.W. "A Note on Two Problems in Connexion with Graphs" *Numerische Mathematik* (1959) 1:269-271.

de Dood, P. et al. "A Two-Dimensional Topological Compactor With Octagonal Geometry" *28th ACM/IEEE Automation Conference* (1991) pp. 727-731.

Doong, K. Y.-Y. et al. "Infrastructure Development and Integration of Electrical-Based Dimensional Process Window Checking" *IEEE Transactions on Semiconductor Manufacturing* (May 2004) 17(2):123-141.

Dutt, S. "New Faster Kernighan-Lin-Type Graph-Partitioning Algorithms" *ICCAD-93—1993 IEEE/ACM International Conference on Computer-Aided Design* (Nov. 7-11, 1993) pp. 370-377.

Façanha, H.S. et al. "Layout Tool for High Speed Electronic and Optical Circuits" *IEE Colloquium on Analogue IC Design: Obstacles and Opportunities* (Jun. 18, 1990) pp. 3/1-3/5.

Façanha, H.S. et al. "Data structures for physical representation of VLSI" *Software Engineering Journal* (Nov. 1990) 5(6):339-349.

Fang, J.P. and S.J. Chen "Tile-Graph-Based Power Planning" *ISCAS'03—Proceedings of the 2003 International Symposium on Circuits and Systems* (May 25-28, 2003) 5:V-501-V-504.

Faroe, O. et al. "Local Search for Final Placement in VLSI Design" *ICCAD 2001—IEEE/ACM International Conference on Computer-Aided Design* (Nov. 4-8, 2001) pp. 565-572.

Gannett, J.W. "SHORTFINDER: A Graphical CAD Tool for Locating Net-to-Net Shorts in VLSI Chip Layouts" *IEEE Transactions on Computer-Aided Design* (Jun. 1990) 9(6):669-674.

Grgek, M. et al. "Performance Comparison of Several Data Structures for Storing VLSI Geometry" *The IEEE Region 8 EUROCON 2003, Computer as a Tool* (Sep. 22-24, 2003) 1:156-159.

Guibas, L.J. and J. Stolfi "On Computing All North-East Nearest Neighbors in the $L_1$ Metric" *Information Processing Letters* (Nov. 8, 1983) 17:219-223.

Hettiaratchi, S. and P.Y.K. Cheung "A novel implementation of tile-based address mapping" *Date'04—Proceedings of the Design, Automation and Test in Europe Conference and Exhibition* (Feb. 16-20, 2004) 1:306-310.

Hsiao, P.-Y. and W.-S. Feng "Using a Multiple Storage Quad Tree on a Hierarchical VLSI Compaction Scheme" *IEEE Transactions on Computer-Aided Design* (May 1990) 9(5):522-536.

Hsiao, P.-Y. et al. "Optimal tile partition for space region of integrated circuits geometry" *IEEE Proceedings-E* (May, 1993) 140(3):145-153.

Hur, S.-W. and J. Lillas "Relaxation and Clustering in a Local Search Framework: Application to Linear Placement" *Proceedings of the 36h Design Automation Conference* (Jun. 21-25, 1999) pp. 360-366.

Hwang, F.K. "An O(n log n) Algorithm for Rectilinear Minimal Spanning Trees" *J ACM* (Apr. 1979) 26(2):177-182.

Iwasaki, H. et al. "An Effective Date Structure for VLSI Layout Systems" *Proceedings of the IEEE International Symposium on Circuits and Systems* (Jun. 11-14, 1991) 5:3134-3137.

Johann, M. and R. Reis "Net by Net Routing with a New Path Search Algorithm" *Proceedings of the 13th Symposium on Integrated Circuits and Systems Design* (Sep. 18-24, 2000) pp. 144-149.

Kiyota, K. and K. Fujiyoshi "Simulated Annealing Search Through General Structure Floorplans Using Sequence-Pair" *ISCAS 2000—Proceedings of the 2000 IEEE International Symposium on Circuits and Systems*, Geneva, Switzerland (May 28-31, 2000) 3:77-80.

Koh, C.-K. and P.H. Madden "Manhattan or Non-Manhattan? A Study of Alternative VLSI Routing Architectures" *Proceedings of the 10th Great Lakes Symposium on VLSI* (Mar. 2000) pp. 47-52.

Kruskal, Jr., J.B. "On the Shortest Spanning Subtree of a Graph and the Traveling Salesman Problem" *Proc. Amer. Math. Soc.* (1956) pp. 48-50.

Ku, L.-P. and H.W. Leong "Note on optimal tile partition for space region of integrated-circuit geometry" *IEE Proceedings on Computers and Digital Techniques* (Jul. 1996) 143(4):246-248.

Kubo, Y. et al. "Self-Reforming Routing for Stochastic Search in VLSI Interconnection Layout" *Proceedings of the ASP-DAC 2000 Asia South Pacific Design Automation Conference* (Jan. 25-28, 2000) pp. 87-92.

Kuh, E.S. and T. Ohtsuki "Recent Advances in VLSI Layout" *Proceedings of the IEEE* (Feb. 1990) 78(2):237-263.

Kunii, T.L. et al. "Hierarchic Shape Description via Singularity and Multiscaling" *COMPSAC 94—Proceedings of the 18th Annual International Computer Software and Applications Conference* (Nov. 9-11, 1994) pp. 242-251.

Lai, G.G. et al. "Hinted Quad Trees for VLSI Geometry DRC Based on Efficient Searching for Neighbors" *IEEE Transactions on Computer-Aided Design of Integrated Circuits and Systems* (Mar. 1996) 15(3):317-324.

Lai, Y.-K. et al. "An Efficient Array Architecture with Data-Rings for 3-Step Hierarchical Search Block Matching Algorithm" *1997 IEEE International Symposium on Circuits and Systems*, Hong Kong (Jun. 9-12, 1997) 2:1361-1364.

Liao, S. et al. "An Efficient External-Memory Implementation of Region Query with Application to Area Routing" *(ICCD'02)—Proceedings of the 2002 IEEE International Conference on Computer Design: VLSI in Computers and Processors* (Sep. 16-18, 2002) pp. 36-41.

Lin, Y.-L. et al. "Routing Using a Pyramid Data Structure" *ICCAD-89—1989 International Conference on Computer-Aided Design* (Nov. 5-9, 1989) pp. 436-439.

Lin, Y.-L. et al. "Hybrid Routing" *IEEE Transactions on Computer-Aided Design* (Feb. 1990) 9(2):151-157.

Linhares, A. "Synthesizing a Predatory Search Strategy for VLSI Layouts" *IEEE Transactions on Evolutionary Computation* (Jul. 1999) 3(2):147-152.

Lodha, S.K. and D. Bhatia "Bipartitioning Circuits using TABU Search" *Proceedings of the 11th Annual IEEE International ASIC Conference* (Sep. 13-16, 1998) pp. 223-227.

Luk, W.K. and A.A. Dean "Multistack Optimization for Data-Path Chip Layout" *IEEE Transactions on Computer-Aided Design* (Jan. 1991) 10(1):116-129.

Margarino, A. et al. "A Tile-Expansion Router" *IEEE Transactions on Computer-Aided Design* (Jul. 1987) 6(4):507-517.

Marple, D. et al. "Tailor: A Layout System Based on Trapezoidal Corner Stitching" *IEEE Transactions on Computer-Aided Design* (Jan. 1990) 9(1):66-90.

Mehta, D. and G. Blust "Corner Stitching for Simple Rectilinear Shapes" *IEEE Transactions on Computer-Aided Design of Integrated Circuits and Systems* (Feb. 1997) 16(2):186-198.

van der Meijs, N.P. and A.J. van Genderen "Space-Efficient Extraction Algorithms" *Proceedings of the 3rd European Conference on Design Automation* (Mar. 16-19, 1992) pp. 520-524.

van der Meijs, N.A. and A.J. van Genderen "An Efficient Algorithm for Analysis of Non-Orthogonal Layout" *ISCAS '89—IEEE International Symposium on Circuits and Systems* (May 8-11, 1989) 1:47-52.

Modarres, H. and R.J. Lomax "A Formal Approach to Design-Rule Checking" *IEEE Transactions on Computer-Aided Design* (Jul. 1987) 6(4):561-573.

Nakatake, S. et al. "Consistent Floorplanning with Hierarchical Superconstraints" *IEEE Transactions on Computer-Aided Design of Integrated Circuits and Systems* (Jan. 2002) 21(1):42-49.

Öten, R. and R. J.P. de Figueiredo "Topological Dimensionality Determination and Dimensionality Reduction Based on Minimum Spanning Trees" *ISCAS '98—Proceedings of the 1998 IEEE International Symposium on Circuits and Systems* (May 31-Jun. 3, 1998) 3:366-369.

Pitaksanonkul, A. et al. "Comparisons of Quad Trees and 4-D Trees: New Results" *IEEE Transactions on Computer-Aided Design* (Nov. 1989) 8(11):1157-1164.

Powers, K.D. et al. "The 60° Grid: Routing Channels In Width $d/\sqrt{3}$" *Proceedings of the 1st Great Lakes Symposium on VLSI* (Mar. 1-2, 1991) pp. 214-219.

Preparata, F.P. and M.I. Shamos, *Computational Geometry An Introduction* (1985) Springer-Verlag New York Inc., 404 Pages.

Prim, R.C. "Shortest Connection Networks and Some Generalizations" *The Bell System Technical Journal* (Nov. 1957) 36(6):1389-1401.

Rothermel, H.-J. and D.A. Mlynski "Automatic Variable-Width Routing for VLSI" *IEEE Transactions on Computer-Aided Design* (Oct. 1983) 2(4):271-284.

Sait, S.M. et al. "Performance and Low Power Driven VLSI Standard Cell Placement using Tabu Search" *CED '02-13 Proceedings of the 2002 Congress on Evolutionary Computation* (May 12-17, 2002) 1:372-377.

Sakanushi, K. and Y. Kajitani "The Quarter-State Sequence (Q-sequence) to Represent the Floorplan and Applications to Layout Optimization" *IEEE APCCAS 2000—The 2000 IEEE Asia-Pacific Conference on Circuits and Systems* (Dec. 4-6, 2000) pp. 829-832.

Salek, A.H. et al. "Hierarchical Buffered Routing Tree Generation" *IEEE Transactions on Computer-Aided Design of Integrated Circuits and Systems* (May 2002) 21(5):554-567.

Sarrafzadeh, M. et al. "Single-Layer Global Routing" *IEEE Transactions on Computer-Aided Design of Integrated Circuits and Systems* (Jan. 1994) 13(1):38-47.

Schmiedle, F. et al. "Exact Routing with Search Space Reduction" *IEEE Transactions on Computers* (Jun. 2003) 52(6):815-825.

Séquin, C.H. and H. da Silva Façanha "Corner-Stitched Tiles with Curved Boundaries" *IEEE Transactions on Computer-Aided Design of Integrated Circuits and Systems* (Jan. 2003) 12(1):47-58.

Serdar, T. and C. Sechen "Automatic Datapath Tile Placement and Routing" *Conference and Exhibition on Design, Automation and Test in Europe* (Mar. 13-16, 2001) pp. 552-559.

Sim, S.-P. et al. "Analytical Capacitance Model for High-Speed Interconnects with Diagonal Routing" *Proceedings of the IEEE 2002 International Interconnect Technology Conference* (Jun. 3-5, 2002) pp. 157-158.

Su, S.J. and Y.S. Kuo "Multicell Quad Trees" *Proceedings of the 3rd European Conference on Design Automation* (Mar. 16-19, 1992) pp. 147-151.

Sun, P.K. "An Octagonal Geometry Compactor" *Proceedings of the 1998 IEEE International Conference on Computer Design: VLSI in Computers and Processor—ICCD '88* (Oct. 3-5, 1988) pp. 190-193.

Suzuki, G. et al. "MOSAIC: A Tile-Based Datapath Layout Generator" *ICCAD-92—1992 IEEE/ACM International Conference on Computer-Aided Design* (Nov. 8-12, 1992) pp. 166-170.

Tan, X. and X. Song "Improvement on the diagonal routing model" *IEE Proceedings on Circuits, Devices and Systems* (Dec. 1994) 141(6):535-536.

Tarjan, R.E., ed. *Data Structures and Network Algorithms* Society for Industrial and Applied Mathematics, Philadelphia, PA (1983) pp. 71-83.

Tsai, C.-C. et al. "An H-V Alternating Router" *IEEE Transactions on Computer-Aided Design* (Aug. 1992) 11(8):976-991.

Tseng, H.-P. and C. Sechen "A Gridless Multi-Layer Router for Standard Cell Circuits using CTM Cells" *ED&TC 97—Proceedings of the European Design and Test Conference* (Mar. 17-20, 1997) pp. 319-326.

Tseng, H.-P. and C. Sechen "A Gridless Multilayer Router for Standard Cell Circuits Using CTM Cells" *IEEE Transactions on Computer-Aided Design of Integrated Circuits and Systems* (Oct. 1999) 18(10):1462-1479.

Tzionas, P.G. et al. "A New, Cellular Automation-Based, Nearest Neighbor Pattern Classifier and Its VLSI Implementation" *IEEE Transactions on Very Large Scale Integration (VLSI) Systems* (Sep. 1994) 2(3):343-353.

Wu, G.-M. et al. "Rectilinear Block Placement Using B*-Trees" *Proceedings of the International Conference on Computer Design* (Sep. 17, 2000) pp. 351-356.

Xing, Z. and R. Kao "Shortest Path Search Using Tiles and Piecewise Linear Cost Propagation" *IEEE Transactions on Computer-Aided Design of Integrated Circuits and Systems* (Feb. 2002) 21(2):145-158.

Xu, N. et al. "TSCSP: Tabu Search Algorithm for VLSI Module Placement Based on the Clustering Sequence-Pair" *5th International Conference on ASIC* (Oct. 21-24, 2003) 1:306-310.

Yamazaki, H. et al. "Optimum Packing of Convex-Polygons by a New Data Structure Sequence-Table" *IEEE APCCAS 2000—The 2000 IEEE Asia-Pacific Conference on Circuits and Systems* (Dec. 4-5, 2000) pp. 821-824.

Yan, Z. et al. "Area Routing Oriented Hierarchical Corner Stisching with Partial Bin" *Proceedings of the ASP-DAC 2000 Asia-South Pacific Design Automation Conference* (Jan. 25-28, 2000) pp. 105-110.

Yu, Z. et al. "Layout-based 3D Solid Modeling for IC" *Proceedings of the 1995 International Symposium on VLSI Technology, Systems and Applications* (May 31-Jun. 2, 1995) pp. 108-112.

Zhang, Y. et al. "A Gridless Router Based on Hierarchical PB Corner Stitching Structure" *IEEE 2002 International Conference on Communications, Circuits and Systems and West Sino Expositions* (Jun. 29-Jul. 1, 2002) 2:1438-1443.

Zheng, S.-Q. et al. "Efficient Maze-Running and Line-Search Algorithms for VLSI Layout" *Proceedings of the IEEE Southeastcon '93* (Apr. 4-7, 1993) 8 Pages.

Zheng, S.Q. et al. "Finding Obstacle-Avoiding Shortest Paths Using Implicit Connection Graphs" *IEEE Transactions on Computer-Aided Design of Integrated Circuits and Systems* (Jan. 1996) 15(1):103-110.

Zheng, S.Q. et al. "Routing Using Implicit Connection Graphs" *9th International Conference on VLSI Design* (Jan. 3-6, 1996) pp. 49-52.

* cited by examiner

| | ORIGINAL LIST | COPY LIST |
|---|---|---|
| 500 | 450-1 | |
| 505 | 460-1 | |
| 510 | 470-1 | |
| 515 | 480-1, 450-2, 485-1 | 470-1 |
| 520 | 460-2 | |

ZONE TREE METHOD AND MECHANISM

FIELD OF THE INVENTION

The present invention relates generally to electronic circuit design and manufacturing, and more particularly to wire routing using an integrated circuit design automation system.

BACKGROUND OF THE INVENTION

A semiconductor integrated circuit (IC) has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design.

After the layout is complete, it is then checked to ensure that it meets the design requirements. The result is a set of design files, which are then converted into pattern generator files. The pattern generator files are used to produced patterns called masks by an optical or electron beam pattern generator. Subsequently, during fabrication of the IC, these masks are used to pattern chips on the silicon wafer using a sequence of photolithographic steps. Electronic components of the IC are therefore formed on the wafer in accordance with the patterns.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

Geometric information about the placement of the nodes and components onto the chip is determined by a placement process and a routing process. The placement process is a process for placing electronic components or circuit blocks on the chip and the routing process is the process for creating interconnections between the blocks and components according to the specified netlist. Placement and routing processes need to be able to search for components within the design. An example of a system that performs line segment range searching is IC Craftsman Layout Automation product, available since at least as early as 1998 from Cooper and Chyan Technology, now owned and distributed by Cadence Design Systems, Inc. of San Jose, Calif.

Advances in manufacturing technologies have allowed modern IC designs to contain extremely large numbers of component elements. This means that modern EDA systems must be able to effectively manage the very large set of geometric information that results from such IC designs. Given that many modern designs may literally contain millions of geometric elements, there is a need for improved methods and mechanisms to manage and track the data associated with these geometric elements.

SUMMARY OF THE INVENTION

In one embodiment, a method of analyzing a design of an electronic circuit uses slices. The method includes generating one or more slices, each slice comprising a contiguous region of the design, and generating an set comprising one or more bins for each slice. A search for an object may be performed by determining a search area, and identifying slices containing at least a portion of the search area. For each identified slice, each object within the search area is associated with one of the bins of the set for the slice.

Other and additional objects, features, and advantages of the invention are described in the detailed description, figures, and claims.

DETAILED DESCRIPTION

The present invention provides a method and mechanism for managing information relating to geometric or geographic elements. An example of a particular application in which it is useful to manage geometric elements is the process for designing, placing, and routing an electronic circuit. For purposes of explanation, the following description is made with respect to managing information regarding geometric elements for the design of an electronic circuit. It is noted, however, that the present invention is applicable to other applications, and is not to be so limited except as specified in the claims.

Figure 1A:
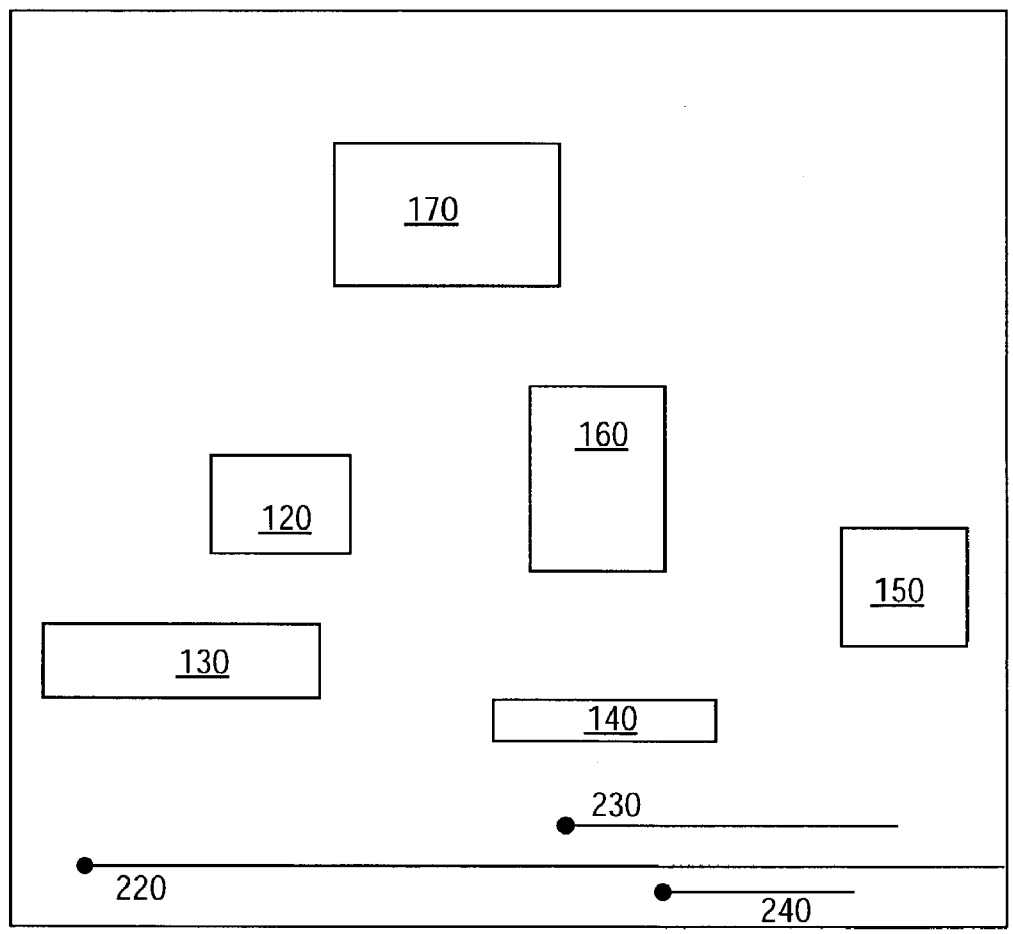
FIG. 1A shows several geometric figures in a region which are represented as a zone tree.

A region of a design having a set of geometric elements is represented herein as a "zone forest" or "forest". Each zone forest may contain geometric elements on multiple layers. A layer of the zone forest is represented herein as a "zone tree" or "tree". A zone tree may be a collection of slices, where the slices are along a common axis. The collection of slices may be disjoint, so that the slices are non-intersecting and non-overlapping. The collection of slices may also be sparse, so that one slice in the collection may not "touch" the next slice in the collection. FIG. 1A depicts an example zone tree 110 containing a portion of an integrated circuit design. Zone tree 110 contains a number of geometric objects 120, 130, 140, 150, 160, 170, 220, 230, and 240. In this example, objects 220, 230, and 240 are represented as line segments to simplify the figures and to show that orthogonal rectangles and non-orthogonal rectangles may be represented in zone trees.

Figure 1B:
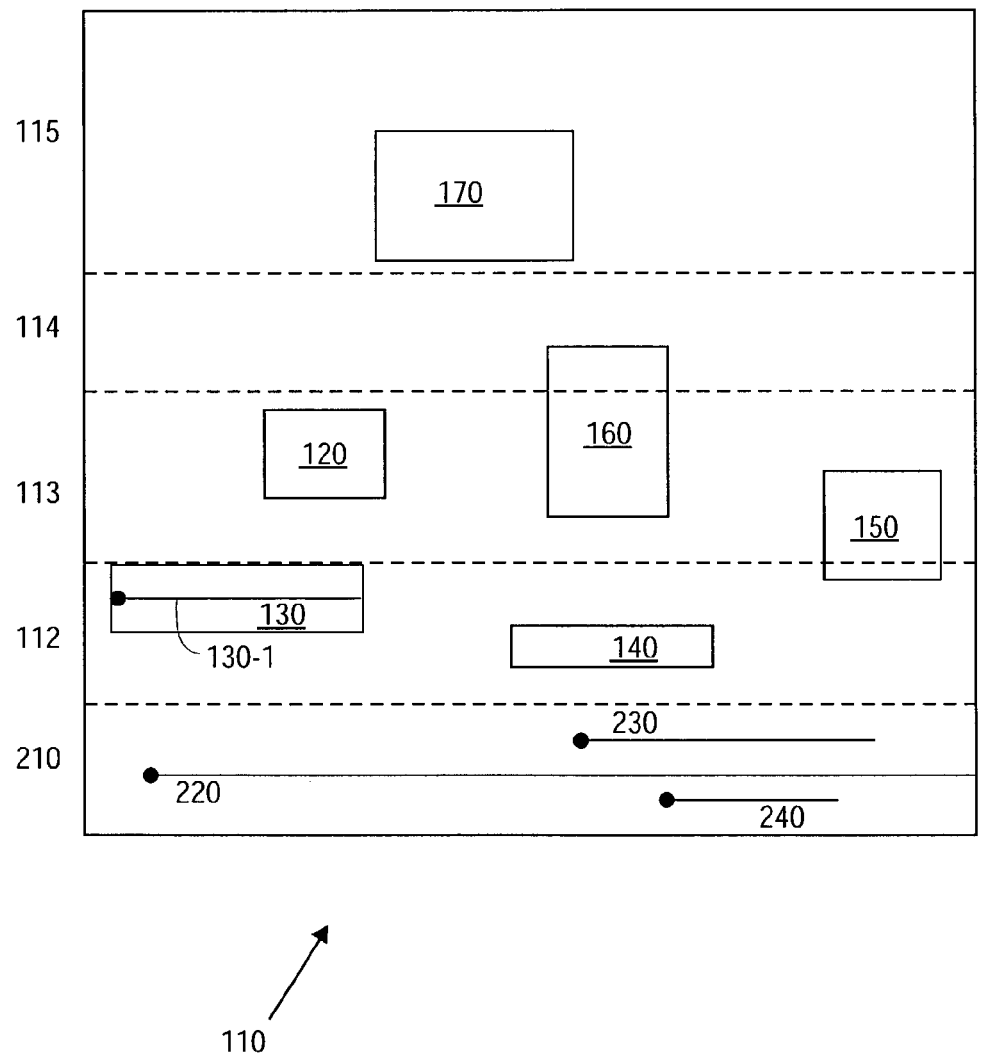
FIG. 1B shows an example a zone tree divided into zone slices.

A zone tree can be partitioned into multiple "zone slices" or "slices" each comprising a portion of the zone tree. A slice may be a set of intervals, which may be disjoint, along a common axis. The set of disjoint intervals may be sparse. Also, if the set of disjoint intervals is in a collection of sets of disjoint intervals, the common axis for the set of disjoint intervals may be perpendicular to the common axis for the collection of sets of disjoint intervals. FIG. 1B shows the zone tree 100 of FIG. 1A horizontally partitioned into a collection of zone slices 112, 113, 114, 115, and 210. A zone slice is a one-dimensional representation of geometric objects within that slice's coverage area. Any slice orientation may be employed, e.g., to form vertical or horizontal slices. The terms horizontal and vertical are used for illustration, and the slices may be represented using an axis other than a horizontal or a vertical axis. The coverage area of zone slices within a zone tree can have differing size and dimensions, as shown in FIG. 1B, in which slice 115 has a larger coverage area than the other slices within zone tree 110. In addition, objects may span across multiple slices, such as objects 150, 160 for example. Objects are mapped to line segments within a zone slice. This is done by intersecting the object with the zone slice and then computing the projection of this intersection onto the slice's common axis. In FIG. 1B, the projection onto the common axis is translated back into the object in order to make the association of the object and the line segment clear. In particular, objects 220, 230, and 240 can be seen to map into themselves. Their projections onto the common axis with slice 210, when translated back, are the objects themselves.

One or more structures are maintained for each zone slice to track the geometric objects associated with the zone slice. A representation of an object may include a pointer to the memory location of the corresponding object that is stored in a database. A stored object may include information such as space tiles, guides, geometric connectivity, range searching, wires, or other components, for example.

Figure 2A:
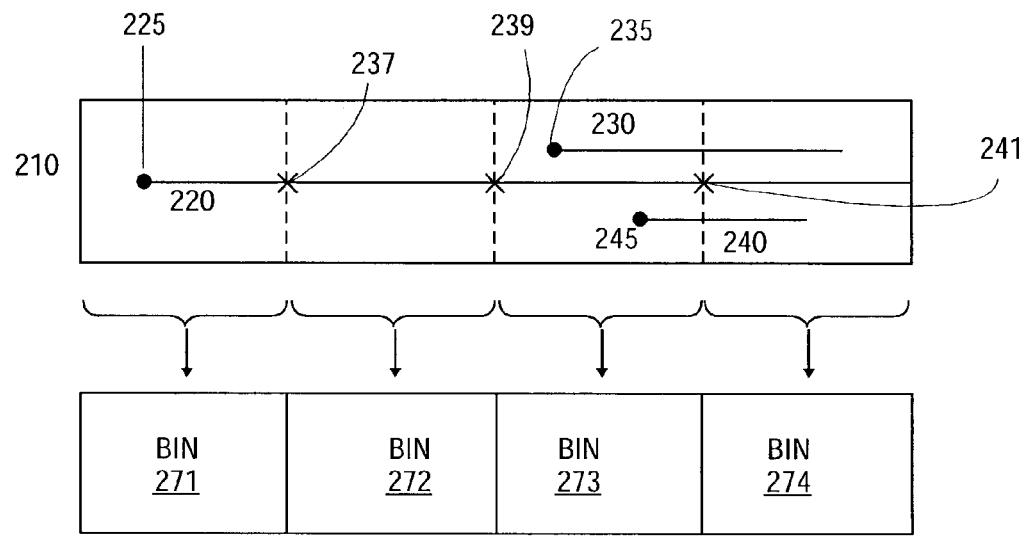
FIGS. 2A and 2B show examples of a slice having bins.

A "bin" refers to a geometric interval having a given coverage dimension (or "snap range") within the zone slice. A bin is an interval containing one or more objects. The objects may either originate within the interval or intersect but not originate within the interval. The bin that contains a pre-end of one or more objects may be referred to as an interesting bin. The portion of the object that originates within the bin may be referred to as the pre-end of the object. For example, an extremity of interest for an object, such as its lower-left vertical and lower-left horizontal positions, may be a pre-end. The portion of the object that intersects but does not originate within the bin may be referred to as an intersection. Each zone slice may contain any number of bins. Referring to FIG. 2A, shown is zone slice 210 from FIG. 1B containing wire objects 220, 230, and 240. Any partitioning method may be used to identify and maintain a set of bins for a zone slice, such as a creating a geometric hash or an array of bins for example. In the example set of bins shown in FIG. 2A, each bin represents a given range for a horizontal axis of the slice. Therefore, the set of bins 271, 272, 273, and 274 divides slice 210 horizontally into several regions.

Each bin may correspond to the location of zero or more objects, or portions of zero or more objects within a slice. As described in more detail below, various geometric analysis actions (such as a nearest neighbor search) may be taken using information relating to whether particular bins contain the locations of one or more objects or objects portions. If only a portion of the one or more objects are located within a bin, the analysis may very well depend on which portion of the object is contained within the coverage area of a bin. Therefore, one useful technique is to specifically identify which bins contain objects or object portions that would be of interest to contemplated geometric analysis actions. In one embodiment, such an identified bin is referred to as an "interesting" bin if it contains at least one "pre-end" of a stored geometric object.

If the leftmost horizontal coordinate is considered the pre-end for a line segment of an object, then in zone slice 210 of FIG. 2A, bins 271 and 273 are considered interesting bins because the ranges of these bins include the leftmost horizontal coordinates for object representations of objects 220, 230, and 240. Neither bin 272 nor bin 274 are considered interesting bins because neither of these bins contain the horizontal coordinates of a pre-end for an object, even though these bins contain other portions of those objects.

Figure 2B:
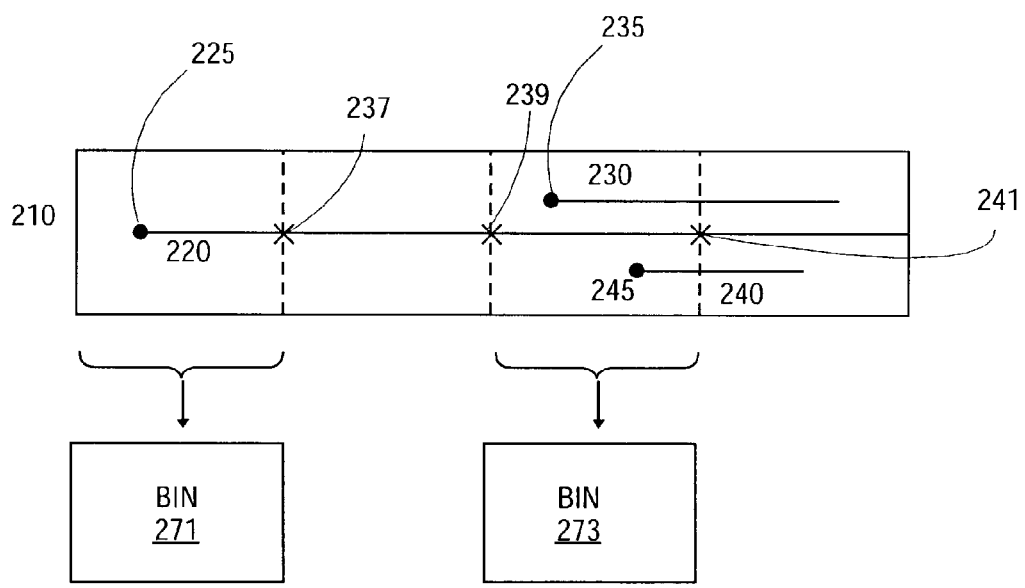

In one embodiment, interesting bins are further analyzed. The areas of a slice that are not associated with interesting bins may be removed from consideration or combined with the interesting bins. For example, FIG. 2B shows slice 210 having interesting bins 271 and 273, but with uninteresting bins 272 and 274 rendered non-visible in the figure. The interesting bins 271 and 273 are further analyzed to consider the object representations within the horizontal ranges of these bins. Object representation 220 includes a pre-end 225, which identifies coordinates of an extremity of the corresponding object, such as a leftmost corner for example. Pre-end 225 is mapped to bin 271. Bin 271 is then used to point to the memory location of the object associated with pre-end 225. Pre-end 235 of representation 230 is mapped to bin 273. Bin 273 points to the corresponding object associated with pre-end 235. Pre-end 245 of representation 240 is also mapped to bin 273.

If an object spans multiple bins, then a collision point occurs when a portion of that object extends into another bin. In one embodiment, collision points are tracked and are mapped to the respective interesting bin at which the collision occurs. Therefore, collision point 239 for object representation 220 is mapped to bin 273. In this embodiment, collision points that occur for uninteresting bins are not tracked. In this example, collision points 237 and 241 occur for object representation 220 at uninteresting bins 272 and 274, respectively. Therefore, these collision points 237 and 241 are not tracked.

Figure 3:
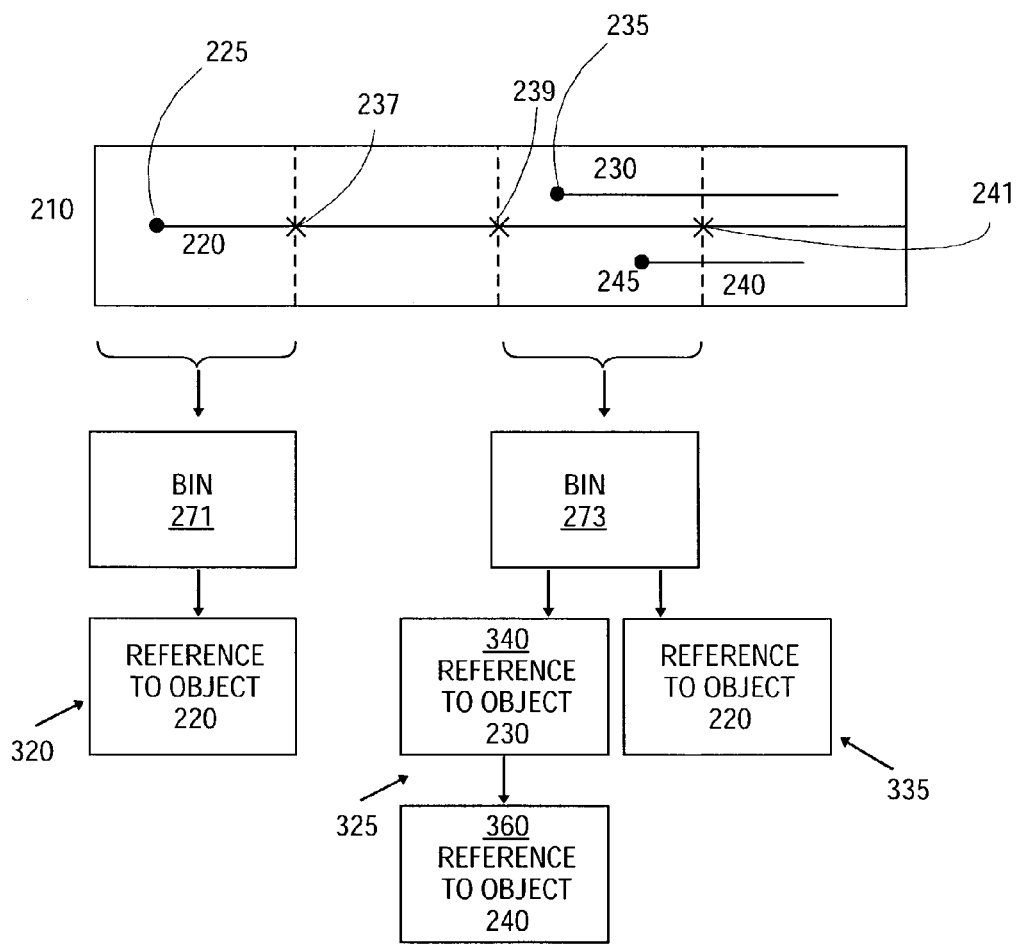
FIG. 3 shows an of objects of a slice mapped to bins.

In one embodiment, if multiple pre-ends are mapped to one bin, then one or more list structures, e.g., linked list structures ("original" lists), or other list structures, may be used to associate the corresponding objects with the bin. For example, as shown in FIG. 3 (which shows the zone slice 210 of FIG. 2B), the pre-end 225 of object representation 220 falls within the snap range of bin 271. A linked list structure 320 that corresponds to bin 271 is used to associate the object 220 with bin 271. Similarly, it can be seen that the pre-ends 235 and 245 of object representations 230 and 240 fall within the snap range of bin 273. A linked list structure 325 comprising list elements 340 and 360 is used to associate objects 230 and 240 with bin 273. In particular, list element 340 provides a reference to object 230 and list element 360 provides a reference to object 240.

In addition to a list of pre-end objects, the set of bins may also include a list of colliding objects. As noted above, a collision occurs when a segment of a representation other than the pre-end corresponds to the snap range of a bin. When this occurs, the resulting collision point is marked in a list ("copy list") corresponding to the bin to associate the collision point with the bin. For example, collision point 239 for object 220 maps to bin 273. Therefore, bin 273 is associated with a second linked list 335 that includes a data element referencing object 220.

The list(s) to identify multiple objects associated with one bin may sort the objects based on a feature of the objects. For example, if bin 273 has sorting factor based on the size of each object, from largest to smallest, then the first entry 340 into the link list 325 of bin 273 is a pointer to the representation of the largest object, such as object 230, for example. The representation of the largest object 230 points to the representation of the second largest object 240 of the list. In this example, each object within the bin's range includes a pointer to the next largest, so that the last item in the link list is the smallest object.

Figure 4A:
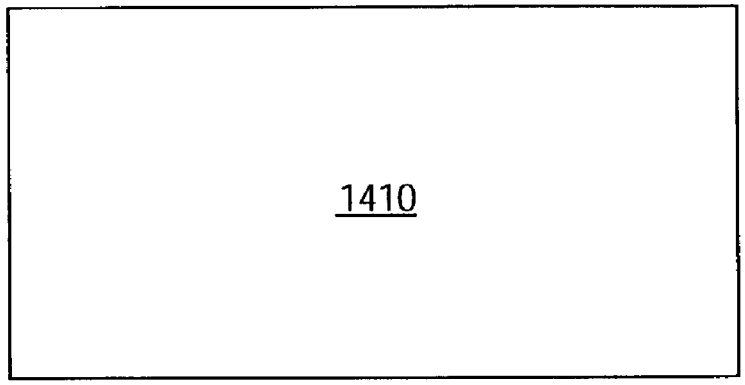
FIGS. 4A, 4B, 4C and 4D show examples of dynamically adjusting the size of a slice or a bin.
Figure 4A:
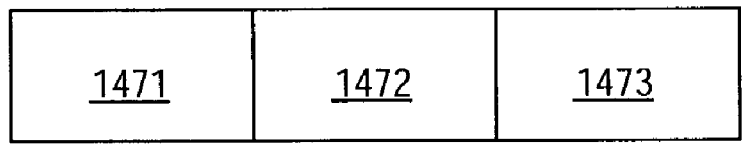
Figure 4B:
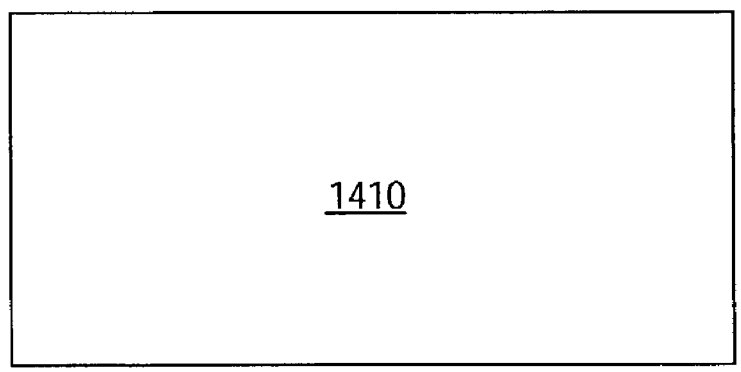
Figure 4B:
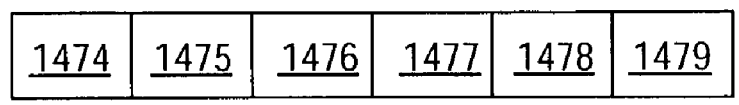

The number of bins for a slice may increase or decrease dynamically. For example, if a threshold number of objects are associated with a given bin, the number of bins of the slice may increase, e.g., double, to reduce the number of objects associated with each bin, as shown in FIGS. 4A and 4B. In this example, the snap range for each bin 1471, 1472, and 1473 of slice 1410 is divided in half when a threshold number of objects associated with one of the bins is reached. In this example, the horizontal range of each bin 1474 through 1479 in FIG. 4B is half of the horizontal range of each previous bin 1471, 1472, and 1473 shown in FIG. 4A. Thus, the horizontal resolution of a slice may be dynamically adjusted by changing the number of bins associated with the slice. It is noted that the extent of changes to the number of bins, and corresponding changes in their associated snap ranges, can be arbitrarily determined, and does not require each increase or decrease to be exact doubling or halving of bins and ranges.

Figure 4C:
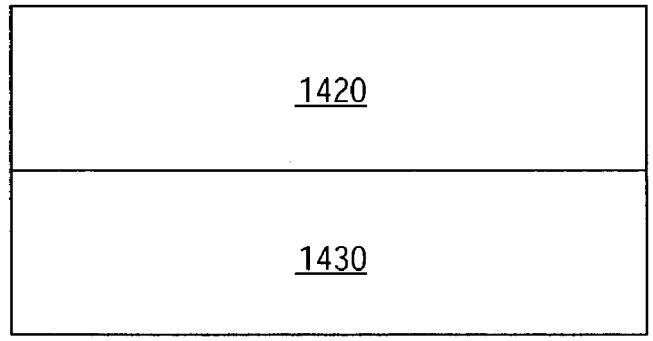

The size of a slice may also be dynamically increased or decreased as shown in FIGS. 4A and 4C. For example, if a threshold number of representations in a slice has been reached, the slice 1410 shown in FIG. 4A may be dynamically divided into multiple smaller slices 1420 and 1430 as shown in FIG. 4C. Thus, the vertical resolution of the slices may be adjusted by changing the number of slices for a region.

Figure 4D:
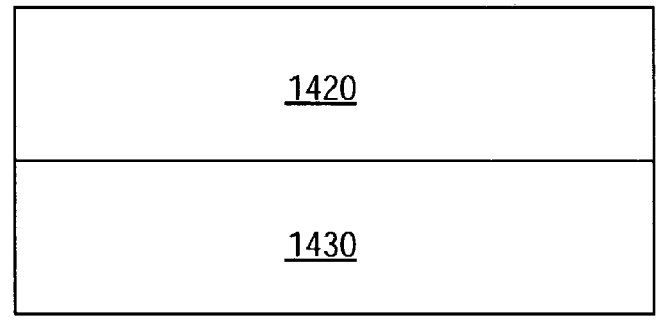

In one embodiment, both the number of slices and the number of bins may be simultaneously increased or decreased, as shown in FIGS. 4A and 4D. In this example, the slice 1410 of FIG. 4A is divided into slices 1420 and 1430 of FIG. 4D. Bins 1471, 1472, and 1473 of FIG. 4A are divided into bins 1481 through 1486 of slice 1420 and bins 1491 through 1496 of slice 1430 as shown in FIG. 4D.

Figure 5A:
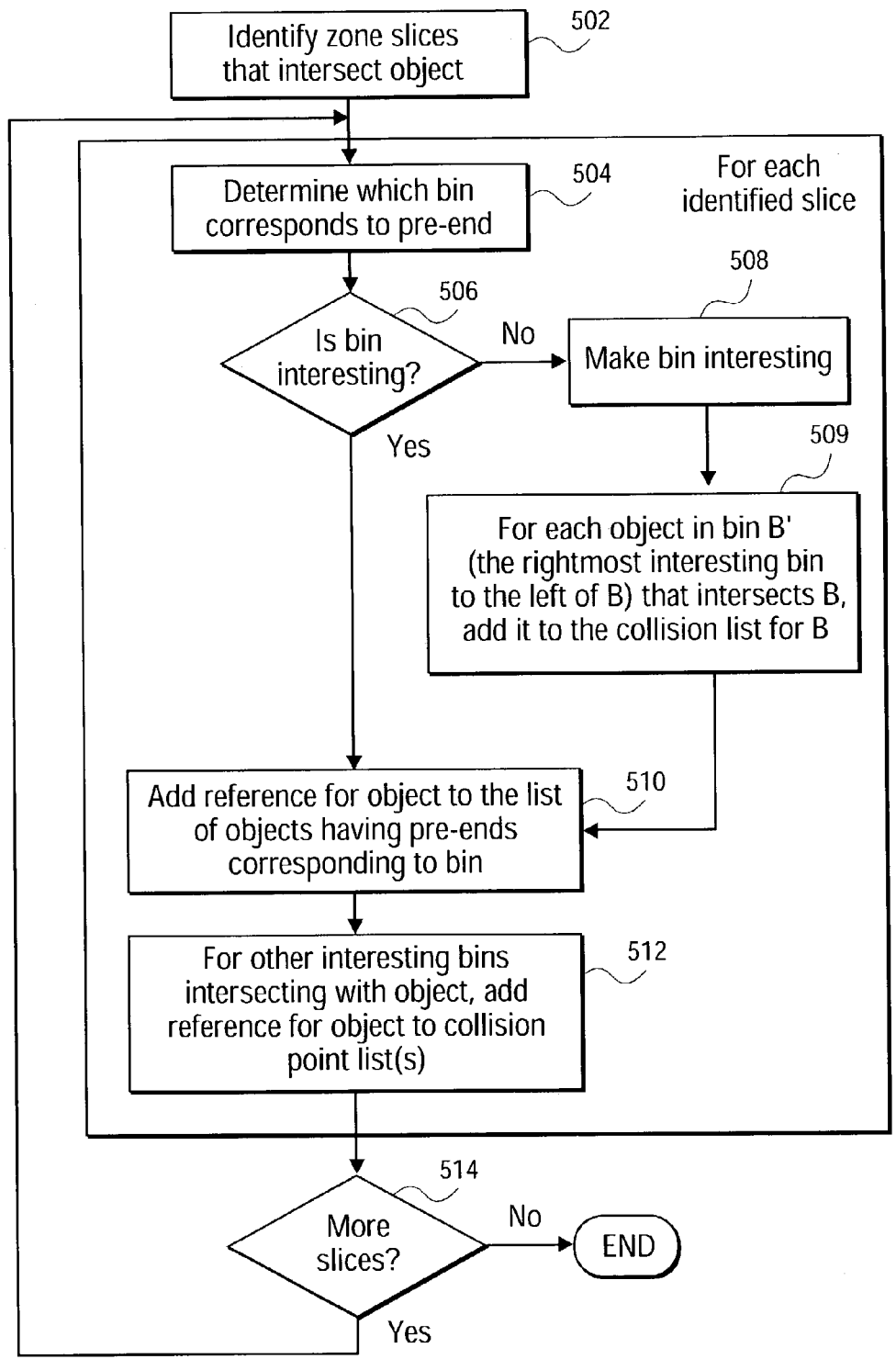
FIGS. 5A and 5B show examples of a method to insert a geometric figure into a zone tree.

FIG. 5A shows a flowchart of an embodiment of a process for inserting a geometric object into a zone tree. The first action in the flowchart is to identify which zone slices intersect with the geometric boundaries of the object (502). For each zone slice, the process identifies the which bin corresponds to the pre-end for the object (504). A determination is made whether the identified bin is an interesting bin (506). If the bin was not previously interesting, then at this point it is designated as being interesting (508). The stored objects that intersect this bin B are added to the collision point list for bin B (509). The only objects that can intersect bin B are in the rightmost interesting bin B' to the left of B. For each object associated with B' that intersects B, add it to the collision list for B (509). A list element corresponding to the inserted object is added to the linked list that is maintained for the identified bin, in which the list element contains a reference to the object (510). If there are any other interesting bins that intersect with the object, then a list element is added to the collision point list for those other bins (512). If these actions cause either the slice or the affected bins to exceed a specified threshold size limitations, then the respective bin or slice can be split. At 514, a determination is made whether there exists any other identified slices that intersect with the object that have not yet been processed. If so, then the process returns back to 504. Otherwise, the process ends.

Figure 5B:
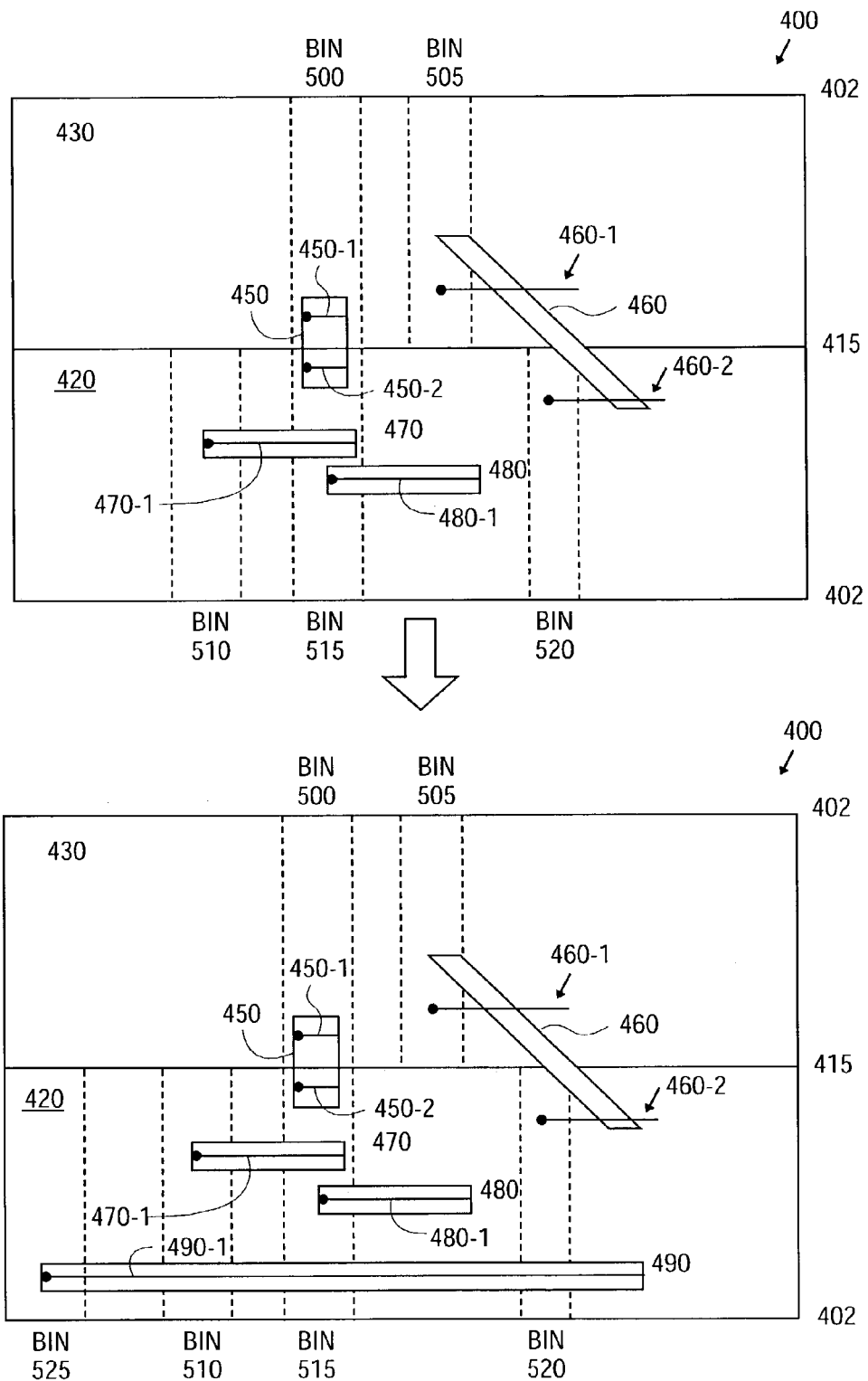

FIG. 5B shows an example of inserting object 490 into the zone tree using the method of FIG. 5A. Each object stored in the zone tree is associated with a group of line segments, one per zone slice that it intersects. For instance, object 450 is associated with representation 450-1 in zone slice 430 and representation 450-2 in zone slice 420. Non-orthogonal object 460 is associated with representations 460-1 in zone slice 430 and 460-2 in zone slice 420.

For each slice that object 490 intersects, the intersection of the object and the slice is determined. In this example, the object 490 intersects with slice 420. The representation of this is depicted as 490-1. The bin that contains the pre-end of object 490-1 is bin 525. Bin 525 is made into an interesting bin, and 490-1 is placed onto the original list of bin 525. The object representation 490-1 intersects interesting bins 510, 515, and 520, so 490-1 is added to the copy lists of those bins. An additional check may be made to examine objects to the left of bin 525. This check may be performed because bin 525 has now become interesting. For example, if a bin 530 is to the left of bin 525, the original and copy lists of bin 530 may be examined, and any object on either of these lists that intersects bin 525 may be added to the copy list of bin 525.

Tables 5a and 5b show the before and after contents of the affected bins in FIG. 5B.

TABLE 5a

Bin Contents Before Insertion

| Bins | Original List | Copy List |
|---|---|---|
| 500 | 450-1 | |
| 505 | 460-1 | |
| 510 | 470-1 | |
| 515 | 480-1, 450-2 | 470-1 |
| 520 | 460-2 | |

TABLE 5b

Bin Contents After Insertion

| Bins | Original List | Copy List |
|---|---|---|
| 500 | 450-1 | |
| 505 | 460-1 | |
| 510 | 470-1 | 490-1 |
| 515 | 480-1, 450-2 | 470-1, 490-1 |
| 520 | 460-2 | 490-1 |
| 525 | 490-1 | |

The following is example pseudocode for implementing an embodiment of a process for insertion of a geometric figure into a zone tree:

(A) Insertion of a geometric figure G into a zone tree:
  a. Determine what zone slices z_i the figure G intersects
  b. For each slice z_i that G intersects:
    i. Determine G(z_i), the intersection of G and slice z_i.
    ii. Determine which bin B_j contains the pre-end of G(z_i).
    iii. If B_j is interesting
      1. Add G(z_i) to the "original" list of B_j. Split bin if too big.
      2. Add G(z_i) to the "copy" list of every other interesting bin it intersects Split bin if too big.
    iv. If B_j is not interesting
      1. Make B_j an interesting bin
      2. Add G(z_i) to the "original" list of B_j. Split bin if too big.
      3. Add G(z_i) to the "copy" list of every other interesting bin it intersects. Split bin if too big.
      4. Find B_k, the rightmost interesting bin to the left of B_j.
      5. If B_k exists
        a. For each object x in B_k's original or copy lists, add x to B_j's copy list if x intersects B_j.
        b. Split B_j if it is too big.
    v. Split z_i if it is too big.

Figure 6A:
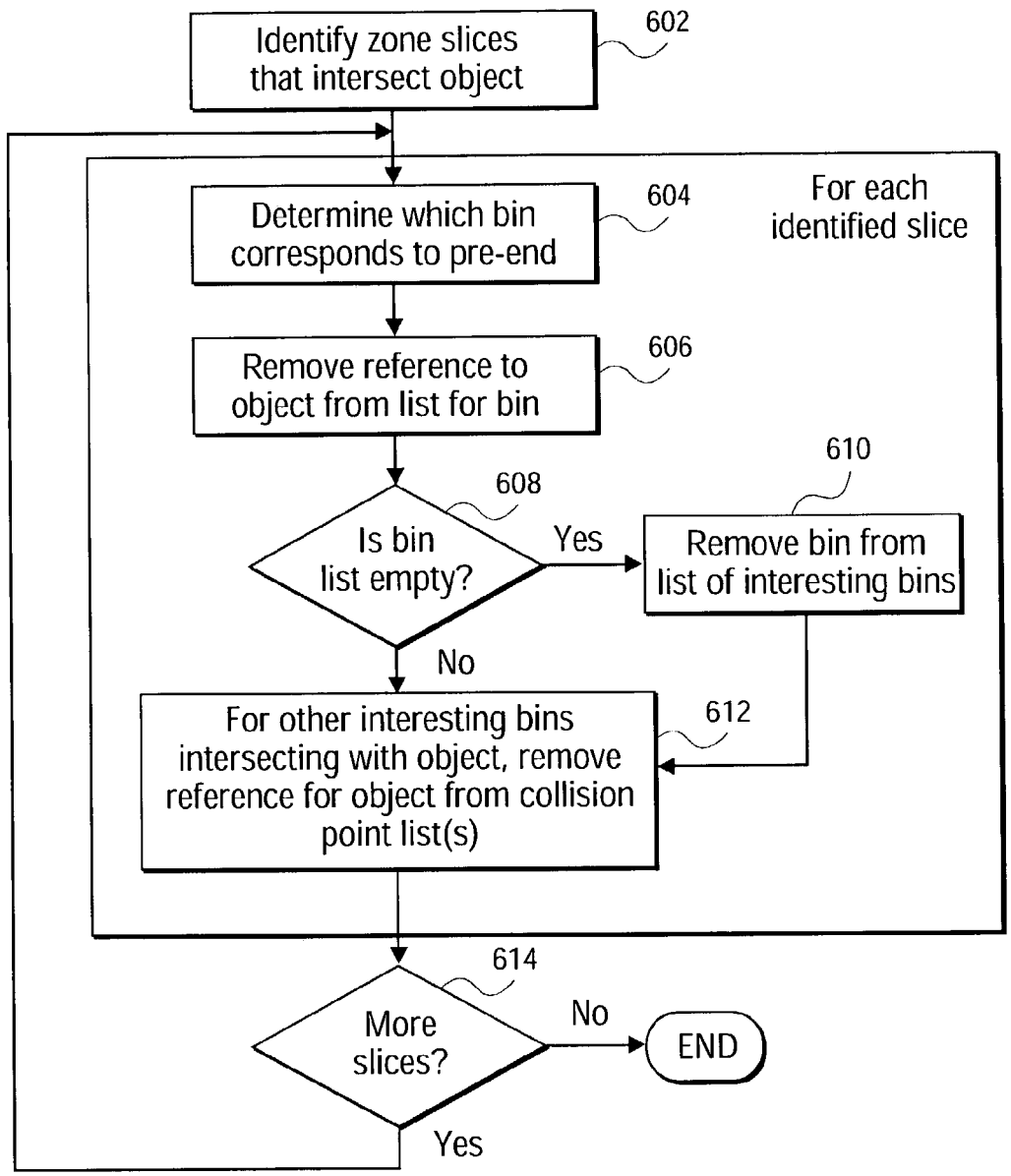
FIGS. 6A and 6B show examples of deleting a geometric figure from a zone tree.

FIG. 6A shows a flowchart of an embodiment of a process for deleting a geometric object from a zone tree. The process identifies which zone slices intersect with the geometric boundaries of the object (602). For each zone slice, the process identifies which bin corresponds to the pre-end for the object (604). At 606, the list element corresponding to the object is removed from the linked list that is maintained for the identified bin. At 608, a determination is made whether the linked list for the identified bin is now empty as a result of 606. If the list is now empty, then remove the identified bin from the list of interesting bins, since removing the object has now made the bin uninteresting (610). When a bin is made uninteresting, its list of collision points is deleted. If there are any other interesting bins that intersect with the object, then remove the corresponding list element for the object from the collision point list for those other bins (612). If these actions cause either the slice or affected bins to fall beneath a specified threshold size limitations, then the respective bin or slice can be combined with another bin or slice. At 614, a determination is made whether there exists any other identified slices that intersect with the object that have not yet been processed. If so, then the process returns back to 604. Otherwise, the process ends.

Figure 6B:
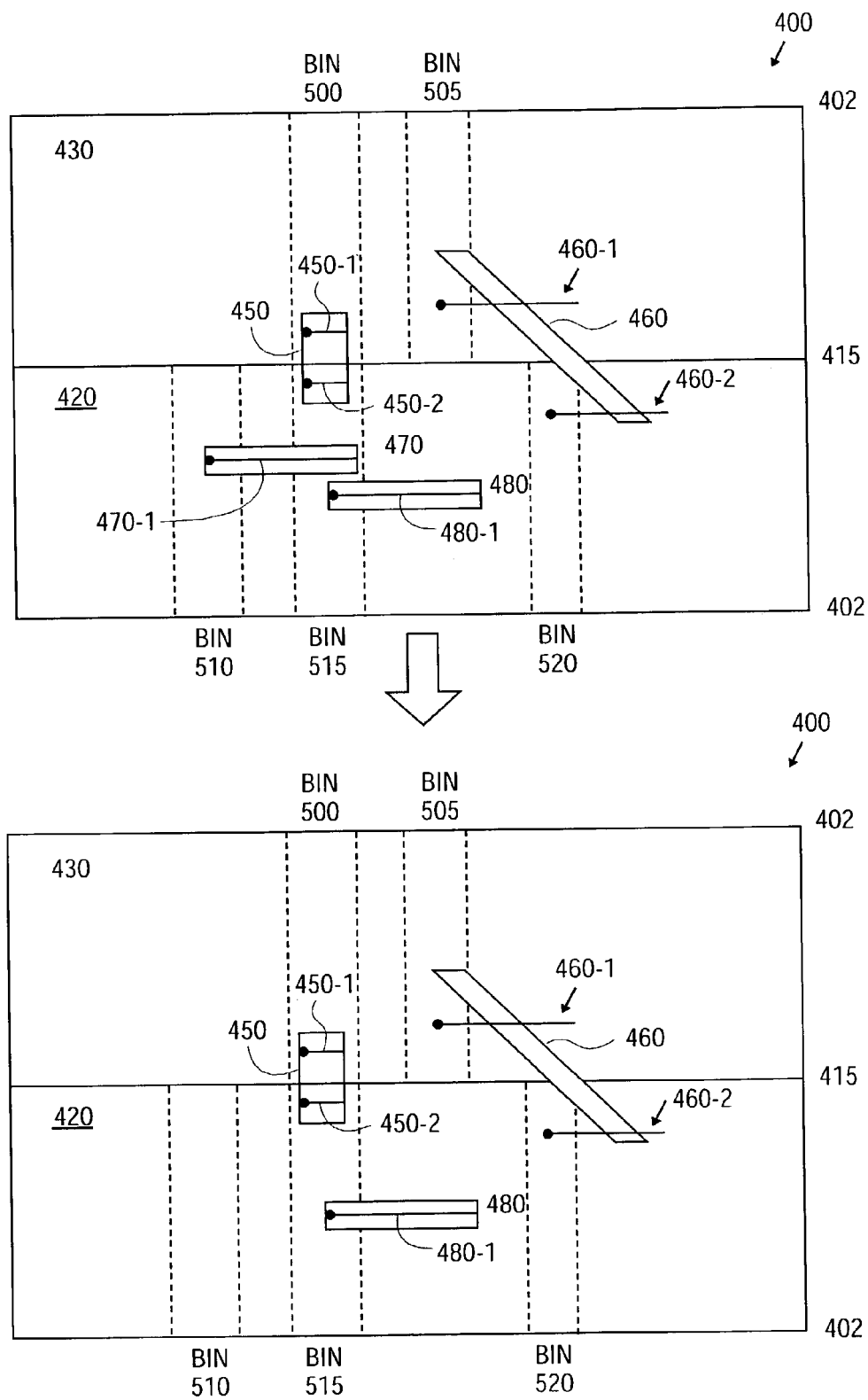

FIG. 6B shows an example of deleting an object 470 from a zone tree using the method of FIG. 6A. The geometric FIG. 470 intersects slice 420. The bin that contains the pre-end of object 470 is bin 510. The object representation 470-1 is removed from bin 510. The bin 510 is now empty, so bin 510 is removed from the list of interesting bins. The object representation 470-1 intersects bin 515, so 470-1 is removed from the copy list of bin 515.

Tables 6*a* and 6*b* show the before and after contents of the affected bins in FIG. 6B.

TABLE 6a

Bin Contents Before Deletion

| Bins | Original List | Copy List |
|------|---------------|-----------|
| 500  | 450-1         |           |
| 505  | 460-1         |           |
| 510  | 470-1         |           |
| 515  | 480-1, 450-2  | 470-1     |
| 520  | 460-2         |           |

TABLE 6b

Bin Contents After Deletion

| Bins | Original List | Copy List |
|------|---------------|-----------|
| 500  | 450-1         |           |
| 505  | 460-1         |           |
| 515  | 480-1, 450-2  |           |
| 520  | 460-2         |           |

The following is example pseudocode for implementing an embodiment of a process for deleting a geometric figure from a zone tree:

(B) Deletion of a geometric figure G from a zone tree.
   a. Determine what zone slices $z_i$ the figure G intersects
   b. For each slice $z_i$ that G intersects:
      i. Find $B_j$, the bin that contains the pre-end of $G(z_i)$.
      ii. Remove G from $B_j$.
      iii. If the original list for $B_j$ is empty, remove $B_j$ from the list of interesting bins.
      iv. For each other bin $B_k$ that $G(z_i)$ intersects, remove G from the copy list of $B_k$. Possibly shrink bins if they are too small.
      v. Possibly combine slices if they are too small.

Figure 7A:
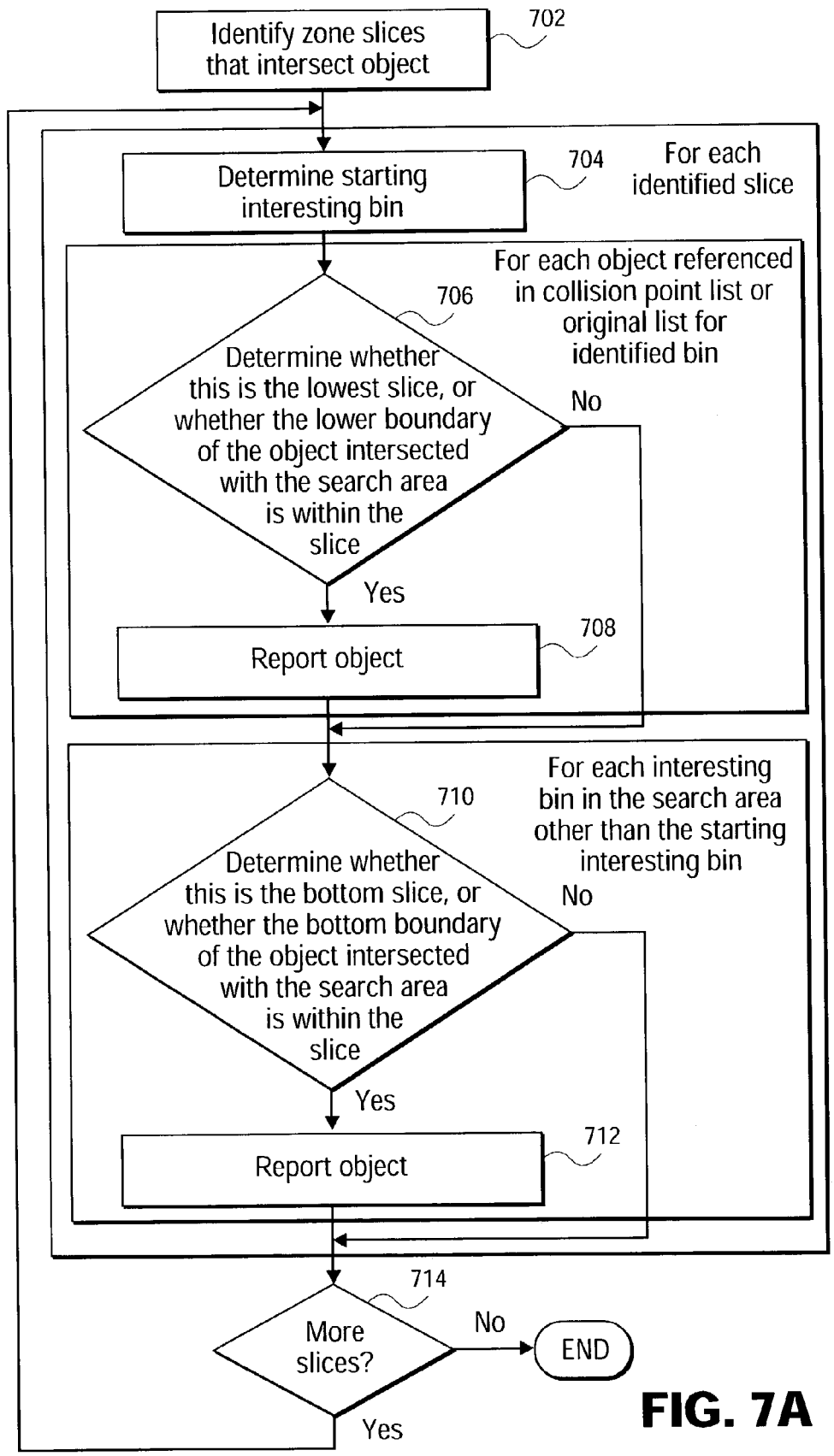
FIGS. 7A and 7B show examples of reporting all geometric objects in a search area in a zone tree.

FIG. 7A shows flowchart of an embodiment of a process to report/search for objects in a given search area of a zone tree. Given an existing zone tree, the process identifies which zone slices intersect with the geometric boundaries of the search area (702). This identifies zone slices containing at least a portion of the search area. Then, for each identified zone slice, identify the starting interesting bin corresponding to the search area (704). This starting interesting bin is identified by finding the left-most bin within the search area. If this bin is interesting, it is the starting interesting bin. If this bin is not interesting, the next interesting bin to its left is the starting interesting bin. For interesting bins that are defined by pre-ends corresponding to the left-most and bottom-most coordinates of an object, this allows the search process to begin at the first bin that would contain an object that can extend into the search area. If interesting bins are defined using other coordinates on an object, then 704 would be adjusted correspondingly based upon the parameters used to define what the respective interesting bins.

For the identified starting interesting bin, a determination is made whether there exists any objects referenced in either the copy/collision-point list or the original list that intersect the search area. If so, the object may be reported. If this is the lowest slice, or if the lower boundary of the object intersected with the search area is within the slice (706), then the identified objects are reported as being within the search area (708).

For each interesting bin in the search area not including the starting interesting bin, the process considers each object having a pre-end within the bins, and which is therefore on the original list for each bin. A determination is made whether the object intersects the search area. If so, the object may be reported. If this is the bottom slice, or the bottom boundary of the object intersected with the search area is within the slice (710), then the identified object is reported as being within the search area (712).

Figure 7B:
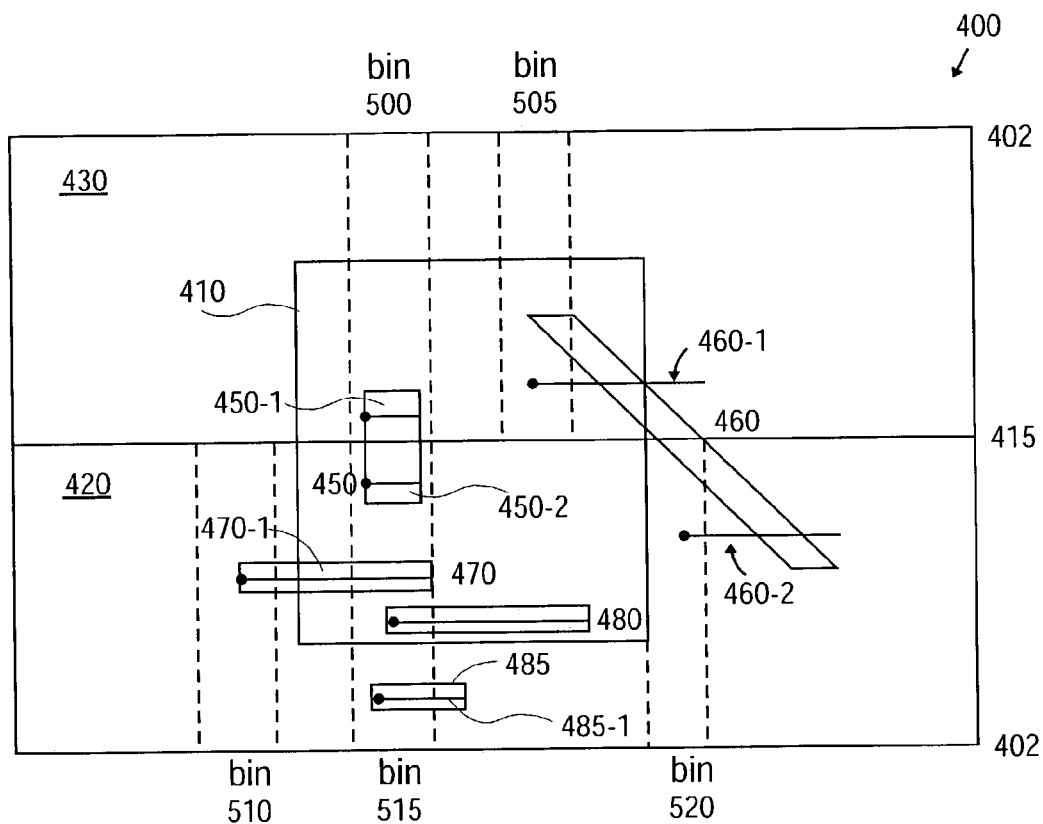

The method of searching as shown by FIG. 7A may be used to search for objects within a region as shown in FIG. 7B. The query area 410 is defined as a search area. When processing slice 420, bins 510, 515 and 520 are considered. Bin 510 is the starting interesting bin. The original list of bin 510 contains object 470, which does intersect 410, so object 470 is reported. The copy list of bin 510 is empty. The original list of bin 515 contains objects 480, 450, and 485. The intersection test shows that objects 480 and 450 intersect the search area 410, but 485 does not. Objects 450 and 480 are reported. For bin 515, only the original list is checked because bin 510 is to its left. For bin 520, diagonal object 460 does not intersect the search area 410 within slice 420. Therefore, object 460 fails the intersection test in slice 420, and is not reported. When processing slice 430, bins 500 and 505 are considered. There is no identified starting bin, so the search proceeds with the bins that intersect the search area. The original list of bin 500 is considered. Object 450 does intersect, but it fails the bounds comparison, because slice 430 is not the bottom slice, and the bottom boundary of the object 450 within the search area 410 extends beyond the boundary of slice 430. Therefore this object 450 was reported in a lower slice, and is not reported again during the examination of slice 430. For bin 505, diagonal object 460 intersects and is reported. The lower boundary of the intersection of 460 and 410 is inside of slice 430, so object 460 passes the bounds comparison for slice 430, and is reported during the examination of slice 430.

The following is example pseudocode for implementing an embodiment of a process for reporting objects within a search area of a zone tree:

(C) Report all objects in a search area A of a zone tree:
  a. Determine what zone slices $z\_i$ the area A intersects
  b. For each zone slice $z\_i$ that A intersects
    i. Determine $A(z\_i)$, the intersection of A and $z\_i$.
    ii. Determine $B\_j$, the starting interesting bin for $A(z\_i)$.
    iii. For each geometric figure G in the original or copy list of $B\_j$.
      1. If $z\_i$ is the lowest slice and G intersects $A(z\_i)$, or if the bottom boundary of G intersected with $A(z\_i)$ is inside zone slice $z\_i$, report it.
    iv. For each interesting bin $B\_k$ in $A(z\_i)$, not including $B\_j$, consider each geometric figure in the original list of $B\_k$.
      1. If $z\_i$ is the lowest slice and G intersects $A(z\_i)$, or if the bottom boundary of G intersected with $A(z\_i)$ is inside zone slice $z\_i$, report it.

The bounds of an object may also be determined by using the zone trees. For example, to find the object in FIG. 7A with the highest (in y) coordinate, check the "original" objects in the interesting bins in the highest slice 430 and record the object with largest y coordinate. To find the object with the lowest (in y) coordinate, check the "original" objects in the interesting bins in the slice 420 having the lowest y coordinates, and record the object with the smallest y coordinate. To find the object with the leftmost (in x) coordinate, check only the "original" objects in the leftmost interesting bin in slices 420, 430. Record the checked object with lowest x coordinate. To find the object with the rightmost (in x) coordinate, check only the "original" and "copy" objects in the rightmost interesting bin in slices 420, 430. Record the checked object with the highest x coordinate. In this way, the "bounding box" of the objects can be computed efficiently without looking at every object.

Figure 8A:
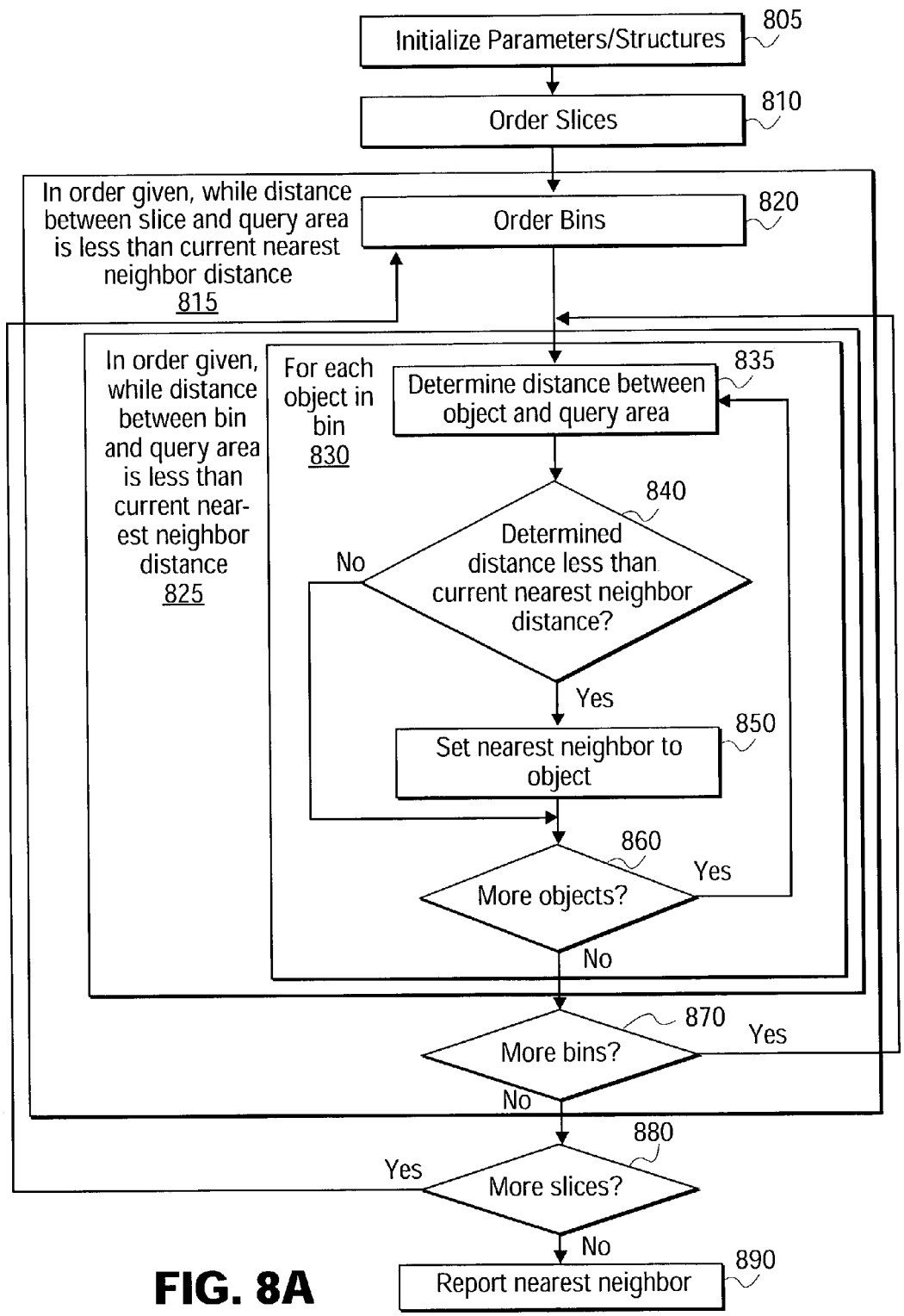
FIGS. 8A and 8B show examples of a method to find a nearest neighbor to a query geometric object in a zone tree.

FIG. 8A shows a method of finding a nearest neighbor to a given region or area of the design. Define a query area within a zone tree, initialize the current nearest neighbor distance as infinity, and initialize the current nearest neighbor as null, 805. Order the slices of the zone tree in non-decreasing distance from the query area, 810. This may be done by determining the distance between each slice and the query area. In the order given, while the distance between a given slice and the query area is less than the current nearest neighbor distance, the slice is examined, 815. Order the bins of the selected slice in non-decreasing distance from the query area, 820. This may be performed by determining the distance between each bin and the query area. In the order of bins given, while the distance between a given bin and the query area is less than the current nearest neighbor distance, examine the bin, 825. For each object in the bin, 830, determine the distance between the object in the selected bin and the query area, 835. If the determined distance is smaller than the current nearest neighbor distance, 840, then replace the current nearest neighbor distance with the determined distance, and replace the current nearest neighbor with the object in the selected bin, 850. If there is another object in the bin, 860, then return to 835. If there are no more objects in the bin, then determine whether there is another bin in the order, 870. If there is another bin, return to 825. If there is not another bin, then determine whether there is another slice, 880. If there is another slice, return to 815. If not, then stop searching, and return the current nearest neighbor as the final nearest neighbor, 880.

Figure 8B:
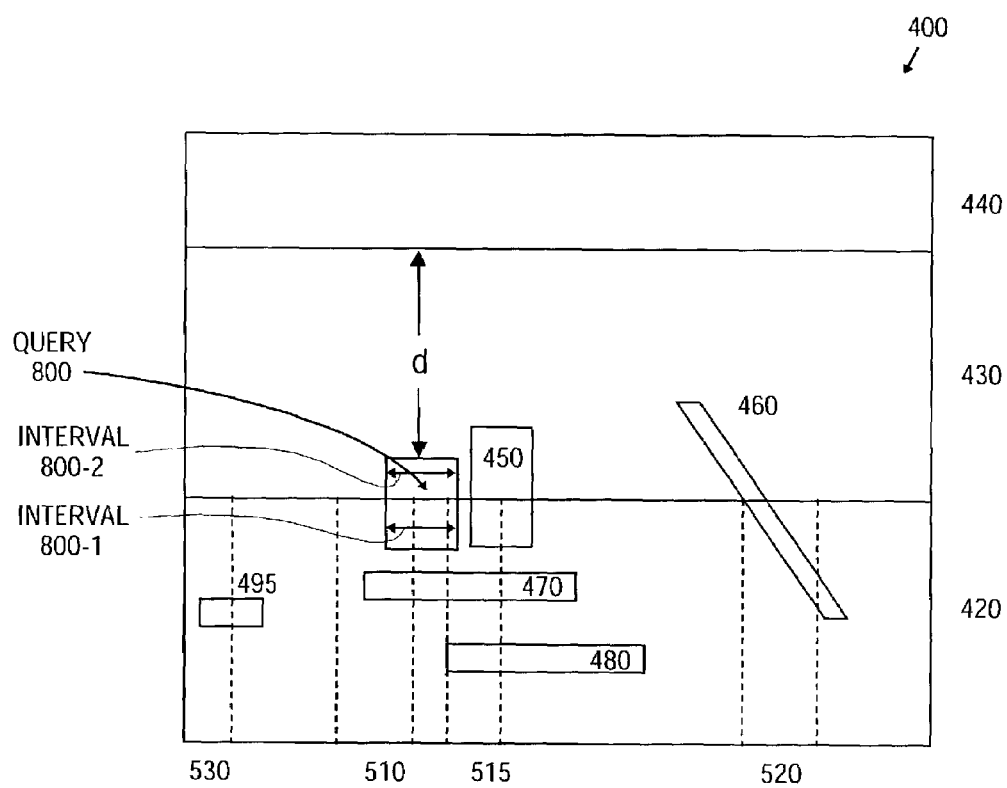

FIG. 8B shows an example of finding a nearest neighbor using the method of FIG. 8A. As shown in FIG. 8B, slices 420 and 430 both intersect query area 800. Slice 440 does not intersect query area 800 and is therefore further away from area 800 than slices 420, 430. The slices are ordered in non-decreasing distance from G (query area 800) as 420, 430, 440. Epsilon, which is the distance to the nearest neighbor, has an initial value of infinity, and the object that is the nearest neighbor to G is initially null. Delta, which is the distance from the search area G to a given slice, is determined for each slice. For slices 420 and 430, delta is zero, and for slice 440, delta is a distance d. For each slice, $G(z\_i)$, the portion of G that is closest to current slice $z\_i$, is determined. If G intersects $z\_i$, then this is the intersection of G and $z\_i$, which is at distance zero. If G is distance delta from $z\_i$, it is the portion of $z\_i$ which is a distance delta away. For slice 420, $G(z\_i)$ is interval 800-1, and for slice 430, $G(z\_i)$ is interval 800-2. Also for each slice, the interesting bins are ordered in non-decreasing distance from $G(z\_i)$. For slice 420, the order is 510, 515, 530, and 520. Then, the distance from $G(z\_i)$ to object 470 in bin 510 is determined, and the distance to object 450 in bin 515 is determined. Bin 530 is further away from the search area than the distance from area 800 to object 450, so bins 530 and 520 are ignored, and object 450 is determined to be the nearest neighbor in slice 420. The processing continues for slice 430, and object 450 remains as the nearest neighbor. Slice 440 is ignored because it is further away from 800 than the distance from 800 to object 450, and object 450 is identified as the nearest neighbor of search area 800.

The following is example pseudocode for implementing an embodiment of a process for identifying the nearest neighbor to a geometric object:

(D) Find nearest neighbor to a geometric object G
  a. Order slices $z\_i$ in non-decreasing distance from G.
  b. Let epsilon=infinity
  c. Let NN(G)=NULL
  d. Determine delta, the distance from G to $z\_i$.
  e. For each slice $z\_i$, in the order given above
    i. If delta>epsilon, return epsilon and NN(G).
    ii. Determine $G(z\_i)$, the portion of $z\_i$ that is closest to G.
    iii. Order the interesting bins in $z\_i$ in non-decreasing distance from $G(z\_i)$.
    iv. For each bin $B\_k$, in the order given
      1. If dist(B,k, G)>=epsilon, stop processing of $z\_i$.
      2. Consider each geometric figure H in the original list of $B\_k$.
      3. If dist(G,H)<epsilon
        a. epsilon=dist(G,H).
        b. NN(G)=H.
    v. Determine $B\_j$, the rightmost interesting bin at or to the left of $G(z\_i)$
    vi. Consider each geometric figure H in the copy list of $B\_j$.
      1. If dist(G,H)<epsilon
        a. epsilon=dist(G,H)
        b. NN(G)=H.

Therefore, what has been described is a method and mechanism for managing information relating to geometric or geographic elements. The present invention may be embodied as any combination of software, hardware, computer usable medium, or manual operations. In one specific embodiment, the invention is embodied as a EDA software tool for placing and/or routing integrated circuit designs.

These and other embodiments of the present invention may be realized in accordance with the above teachings and it should be evident that various modifications and changes may be made to the above described embodiments without departing from the broader spirit and scope of the invention. The specification and drawings are, accordingly, to be regarded in an illustrative rather than restrictive sense and the invention measured only in terms of the claims.

The invention claimed is:

1. A method of analyzing a design of an electronic circuit comprising:
   determining a search area;
   generating one or more zone slices, each zone slice comprising a region of the design;
   identifying zone slices containing at least a portion of the search area;
   for each identified zone slice, examining a set of bins in the search area and associated with the slice;
   outputting each object in each bin within the search area; and
   wherein said outputting each object in each bin within the search area comprises generating an original list of objects originating within the search area.

2. The method of claim 1, wherein generating an original list of objects further comprises:
   mapping a pre-end of each object within the search area to a bin of the set.

3. The method of claim 2, wherein multiple objects are mapped to the same bin, the method further comprising:
   sorting multiple objects mapped to the same bin based on a feature of the objects.

4. A method of analyzing a design of an electronic circuit comprising:
   determining a search area;
   generating one or more zone slices, each zone slice comprising a region of the design;
   identifying zone slices containing at least a portion of the search area;
   for each identified zone slice, examining a set of bins in the search area and associated with the slice;
   outputting each object in each bin within the search area; and
   wherein said outputting each object in each bin within the search area comprises generating an overlap list of objects, each overlapping object overlapping at least a portion of another object within the search area.

5. The method of claim 4, wherein generating the overlap list further comprises:
   identifying an overlap point of each overlapping object relative to a pre-end of another object; and
   mapping each overlap point to a bin of the set.

6. The method of claim 5, wherein multiple overlap points are mapped to the same bin, the method further comprising:
   generating a link list for each overlap points of the bin.

7. The method of claim 5 further comprising:
   identifying a first bin of the set;
   identifying overlap points mapped to the first bin;
   identifying each object having an overlap point mapped to the first bin.

8. A method of analyzing a design of an electronic circuit comprising:
   determining a search area;
   generating one or more zone slices, each zone slice comprising a region of the design;
   identifying zone slices containing at least a portion of the search area;
   for each identified zone slice, examining a set of bins in the search area and associated with the slice;
   outputting each object in each bin within the search area; and
   dynamically adjusting a size of at least one of the bins of a zone slice by dividing a snap range of the bin among a plurality of bins.

9. The method as in any one of claims 1, 4 and 8 further comprising:
   dynamically adjusting a size of a zone slice by dividing the zone slice into a plurality of zone slices.

10. The method as in any one of claims 1, 4 and 8 further comprising:
    identifying an object within the search area based on sets of bins for the slices; and
    deleting the identified object.

11. The method as in any one of claims 1, 4 and 8 further comprising:
    identifying a location within one of the slices; and
    inserting an object into the location.

12. The method as in any one of claims 1, 4 and 8, wherein each object is a representation of a component of an electronic circuit.

13. A method of analyzing a design of an electronic circuit comprising:
    determining a search area;
    generating one or more zone slices, each zone slice comprising a region of the design;
    identifying zone slices containing at least a portion of the search area;
    for each identified zone slice, examining a set of bins in the search area and associated with the slice;
    outputting each object in each bin within the search area;
    for each identified zone slice, determining whether the search area extends to a neighboring zone slice;
    determining whether an object within the search area has a portion crossing a point on a boundary between the identified zone slice and the neighboring zone slice;
    determining whether the portion crossing a point is within the search area; and
    excluding the object from the set for the identified zone slice.

14. A method of analyzing a design of an electronic circuit comprising:
    generating one or more slices, each slice comprising a region of the design;
    generating a set of bins for each slice;
    associating each object within each slice with a bin of the set of bins for the slice; and
    wherein associating each object comprises generating an original list of objects originating within the bin.

15. The method of claim 14, wherein generating an original list of objects further comprises:
    mapping a pre-end of each object to a bin of the set.

16. The method of claim 15, wherein multiple objects are mapped to the same bin, the method further comprising:
    sorting multiple objects mapped to the same bin based on a feature of the objects.

17. A method of analyzing a design of an electronic circuit comprising:
    generating one or more slices, each slice comprising a region of the design;
    generating a set of bins for each slice;
    associating each object within each slice with a bin of the set of bins for the slice; and wherein associating each object comprises generating an overlap list of objects, each overlapping object overlapping at least a portion of another object within the slice.

18. The method of claim 17, wherein generating the overlap list further comprises:
   identifying an overlap point of each overlapping object relative to a pre-end of another object; and
   mapping each overlap point to a bin of the set.

19. The method as in any one of claims 14 and 17 further comprising:
   identifying an object within one of the slices; and
   deleting the identified object from the design of the electronic circuit.

20. The method as in any one of claims 14 and 17 further comprising:
   identifying a location within one of the slices; and
   inserting an object into the location.

21. An apparatus for analyzing a design of an electronic circuit comprising:
   means for generating one or more slices, each slice comprising a region of the design;
   means for generating a set of bins for each slice;
   means for associating each object within each slice with a bin of the set of bins for the slice; and
   wherein said means for associating each object comprises means for generating an original list of objects originating within the bin.

22. The apparatus of claim 21, wherein said means for generating an original list of objects further comprises:
   means for mapping a pre-end of each object to a bin of the set.

23. The apparatus of claim 22, the apparatus further comprising:
   means for sorting multiple objects mapped to the same bin based on a feature of the objects when multiple objects are mapped to the same bin.

24. An apparatus for analyzing a design of an electronic circuit comprising:
   means for generating one or more slices, each slice comprising a region of the design;
   means for generating a set of bins for each slice;
   means for associating each object within each slice with a bin of the set of bins for the slice; and
   wherein said means for associating each object comprises means for generating an overlap list of objects, each overlapping object overlapping at least a portion of another object within the slice.

25. An apparatus for analyzing a design of an electronic circuit comprising:
   means for generating one or more slices, each slice comprising a region of the design;
   means for generating a set of bins for each slice;
   means for associating each object within each slice with a bin of the set of bins for the slice; and
   means for dynamically adjusting a size of at least one of the bins of a slice by dividing a snap range of the bin among a plurality of bins.

26. The apparatus as in any one of claims 21, 24, and 25 further comprising:
   means for dynamically adjusting a size of one of the slices by dividing the slice into a plurality of slices.

27. The apparatus as in any one of claims 21, 24, and 25 further comprising:
   means for identifying an object within one of the slices; and
   means for deleting the identified object from the design of the electronic circuit.

28. The apparatus as in any one of claims 21, 24, and 25 further comprising:
   means for identifying a location within one of the slices; and
   means for inserting an object into the location.

29. The apparatus as in any one of claims 21, 24, and 25, wherein each object is a representation of a component of an electronic circuit.

30. An article of manufacture comprising a tangible computer readable medium storing instructions which, when executed by a processing system, cause the system to perform a method of analyzing a design of an electronic circuit, the method comprising:
   generating one or more slices, each slice comprising a region of the design;
   generating a set of bins for each slice;
   associating each object within each slice with a bin of the set of bins for the slice; and
   generating an original list of objects originating within the bin.

31. An article of manufacture comprising a tangible computer readable medium storing instructions which, when executed by a processing system, cause the system to perform a method of analyzing a design of an electronic circuit, the method comprising:
   generating one or more slices, each slice comprising a region of the design;
   generating a set of bins for each slice;
   associating each object within each slice with a bin of the set of bins for the slice; and
   generating an overlap list of objects, each overlapping object overlapping at least a portion of another object within the slice.

32. An article of manufacture comprising a tangible computer readable medium storing instructions which, when executed by a processing system, cause the system to perform a method of analyzing a design of an electronic circuit, the method comprising:
   generating one or more slices, each slice comprising a region of the design;
   generating a set of bins for each slice;
   associating each object within each slice with a bin of the set of bins for the slice; and
   dynamically adjusting a size of at least one of the bins of a slice by dividing snap range of the bin among a plurality of bins.

33. The article of manufacture as in any one of claims 30, 31, and 32 wherein said method further comprising:
   dynamically adjusting a size of one of the slices by dividing the slice into a plurality of slices.

34. The article of manufacture as in any one of claims 30, 31, and 32 wherein said method further comprising:
   identifying an object within one of the slices; and
   deleting the identified object from the design of the electronic circuit.

35. The article of manufacture as in any one of claims 30, 31, and 32 wherein said method further comprising:
   identifying a location within one of the slices; and
   inserting an object into the location.

36. The article of manufacture as in any one of claims 30, 31, and 32, wherein each object is a representation of a component of an electronic circuit.

* * * * *